(12) United States Patent
Saitoh et al.

(10) Patent No.: US 7,686,971 B2
(45) Date of Patent: Mar. 30, 2010

(54) PLASMA PROCESSING APPARATUS AND METHOD

(75) Inventors: Mitsuo Saitoh, Neyagawa (JP); Tomohiro Okumura, Kadoma (JP)

(73) Assignee: Panasonic Corporation, Osaka (JP)

( * ) Notice: Subject to any disclaimer, the term of this patent is extended or adjusted under 35 U.S.C. 154(b) by 1030 days.

(21) Appl. No.: 11/283,752

(22) Filed: Nov. 22, 2005

(65) Prior Publication Data

US 2006/0270220 A1 Nov. 30, 2006

(30) Foreign Application Priority Data

Nov. 24, 2004 (JP) ............................. 2004-338418

(51) Int. Cl.
*B44C 1/22* (2006.01)
*C23C 16/00* (2006.01)
*H01L 21/00* (2006.01)

(52) U.S. Cl. ............... 216/67; 156/345.43; 156/345.44; 118/719; 438/706; 438/710

(58) Field of Classification Search .................. 216/67; 156/345.43, 345.44; 118/719; 438/706, 438/710

See application file for complete search history.

(56) References Cited

U.S. PATENT DOCUMENTS 5,628,869 A * 5/1997 Mallon ....................... 438/694
5,990,016 A * 11/1999 Kim et al. ................... 438/707
2002/0129902 A1* 9/2002 Babayan et al. ........ 156/345.45

FOREIGN PATENT DOCUMENTS

| JP | 3014111 | 12/1999 |
|---|---|---|
| JP | 2003-217898 | 7/2003 |
| JP | 2004-111949 | 4/2004 |

* cited by examiner

*Primary Examiner*—Shamim Ahmed
(74) *Attorney, Agent, or Firm*—Wenderoth, Lind & Ponack, L.L.P.

(57) ABSTRACT

A plasma source includes a gas flow channel formed therein and an electrode which is fed with electric power or grounded to be maintained at a controlled electric potential and a surface of the plasma source including an opening portion of a first gas ejecting port can be placed in parallel to a position at which a to-be-processed object can be placed. The plasma source is connected to a first gas supplying device through a gas supplying port 4 and has a multi-layer construction that is constituted from two or more layers. Gas flow channels within the multi-layer construction include buffer spaces and at least one space cross-sectional area parallel to the opening cross-sectional area of the first gas ejecting ports, out of the cross-sectional areas of the buffer spaces, is greater than the opening cross-sectional area of the first gas ejecting ports.

6 Claims, 25 Drawing Sheets

Fig. 10

| | ETCHING DEPTH Y (μm) | LINE WIDTH X1 OF UPPER END PORTION OF ETCHING GROOVE (μm) | LINE WIDTH X2 OF BOTTOM PORTION OF ETCHING GROOVE (μm) | ANGLE α (deg.) |
|---|---|---|---|---|
| FIRST EMBODIMENT | 663 | 1075 | 868 | 75.4 |
| SECOND EMBODIMENT | 688 | 1120 | 890 | 74.4 |
| THIRD EMBODIMENT | 653 | 1370 | 870 | 57.5 |
| FOURTH EMBODIMENT | 655 | 652 | 502 | 79.2 |
| FIFTH EMBODIMENT | 662 | 999 | 859 | 80.0 |
| SIXTH EMBODIMENT | 620 | 1050 | 762 | 68.8 |
| SEVENTH EMBODIMENT | 603 | 930 | 840 | 82.9 |
| EIGHTH EMBODIMENT | 760 | 952 | 902 | 86.9 |

PLASMA PROCESSING APPARATUS AND METHOD

BACKGROUND OF THE INVENTION

The present invention relates to a plasma processing apparatus and a plasma processing method that utilize plasma.

Generally, in applying a patterning process with a depth on the order of several hundreds nanometers to several hundreds micrometers to a to-be-processed object as typified by a substrate including a thin film formed on its surface, a resist process is utilized. FIG. 16A to FIG. 16D illustrate an example thereof. Referring to FIG. 16A to FIG. 16D, a photosensitive resist 30 is applied to the surface of a to-be-processed object 29 (FIG. 16A). By applying light exposure thereto with an exposure apparatus and then performing development, the resist 30 can be patterned into a desired shape (FIG. 16B). Then, the to-be-processed object 29 is placed within a vacuum chamber and plasma is generated within the vacuum chamber. Then, an etching process is applied to the to-be-processed object 29 by using the resist 30 as a mask to pattern the surface of the to-be-processed object 29 into a desired shape (FIG. 16C). Finally, the resist 30 is removed using oxygen plasma or an organic agent to complete the process (FIG. 16D)

Resist processes as described above have played important roles in fabricating electronic devices such as semiconductor devices, since the resist processes are suitable for forming fine patterns with high accuracy. However, such resist processes have the drawback of complicacy of processes.

Therefore, there have been conducted studies for new processing methods without usage of resist processes. As an example, FIGS. 17 to 21 illustrate the structure of a plasma processing apparatus incorporating a micro-plasma source. FIG. 17 illustrates an exploded view of the micro-plasma source. The micro-plasma source is constituted by a ceramic outer plate 31, inner plates 31 and 33, an outer plate 34 and a plate-shaped electrode 35, all of which have a thickness of 1 mm. Further, the outer plates 31 and 34 are provided with an outer gas flow channel 36 and an outer gas ejecting port 37 while the inner plates 32 and 33 are provided with an inner gas flow channel 38 and an inner gas ejecting port 39. A material gas to be ejected from the inner gas ejecting port 39 is supplied from an inner gas supplying port 40 provided through the outer plate 31 to the inner gas flow channel 38 via through holes 41 provided through the inner plate 32 and the plate-shaped electrode 35.

Further, a material gas to be ejected from the outer gas ejecting port 37 is supplied from an outer gas supplying port 42 provided through the outer plate 31 to the outer gas flow channel 36 via through holes 43 provided through the inner plate 32, the inner plate 33, and the plate-shaped electrode 35. Further, the plate-shaped electrode 35 to be subjected to a high-frequency power supply thereto is inserted between the inner plates 32 and 33 and is wired to a power supply portion through a drawing portion 44.

FIG. 18 illustrates a plan view of the micro-plasma source, viewed from the side of the gas ejecting ports. There are provided the outer plate 31, the inner plates 32 and 33, the outer plate 34, and the plate-shaped electrode 35, wherein the outer gas ejecting ports 37 are provided between the outer plate 31 and the inner plate 32 and between the inner plate 33 and the outer plate 34 and the inner gas ejecting ports 39 are provided between the inner plate 32 and the plate-shaped electrode 35 and between the inner plate 33 and the plate-shaped electrode 35. The length e of the inner gas ejecting ports 39 in the line direction is 30 mm, and the length f of the outer gas ejecting ports 37 in the line direction is 36 mm, which is greater than the length e of the inner gas ejecting ports 39 in the line direction. The length g of the plate-shaped electrode 35 in the line direction is 30 mm.

FIG. 19 illustrates a cross-sectional view of a to-be-processed object 15 and the micro-plasma source, taken along a surface perpendicular to the to-be-processed object 15. The micro-plasma source is constituted by the ceramic outer plate 31, the inner plates 32 and 33, the outer plate 34, and the plate-shaped electrode 35, wherein the outer plates 31 and 34 are provided with the outer gas ejecting ports 37 while the inner plates 32 and 33 are provided with the inner gas ejecting ports 39. The plate-shaped electrode 35 is maintained at a ground electric potential while a counter electrode 46 to be fed with a high-frequency electric power is placed at a position opposing to the micro-plasma source. The inner gas ejecting ports 39 between the inner plate 32 and the plate-shaped electrode 35 and between the inner plate 33 and the plate-shaped electrode 35, which are opening portions of the micro-plasma source, have a fine line width of 0.05 mm.

In a plasma processing apparatus incorporating the micro-plasma source having the aforementioned structure, helium (He) is supplied from the inner gas ejecting ports and sulfur hexafluoride ($SF_6$) is supplied from the outer gas ejecting ports while a high-frequency electric power is applied to the counter electrode 46, thus applying an etching process to a fine line-shaped portion of the to-be-processed object 15. This is because micro-plasma can be generated only near the inner gas ejecting ports 39 where helium is concentrated, by utilizing the difference of the tendency to cause electric discharge under pressures near the atmospheric pressure between helium and sulfur hexafluoride (helium tends to cause electric discharge more significantly than sulfur hexafluoride).

Japanese Unexamined Patent Publication No. 2004-111949 describes, in detail, the application of a line-shaped process to Si employed as a to-be-processed object, by utilizing a plate-shaped electrode having sharp-angular portions in a plasma processing apparatus incorporating a micro-plasma source having the aforementioned structure. Japanese Examined Patent Publication No. 3014111 describes characteristics of atmospheric-pressure glow plasma, particularly, etching.

By using the aforementioned plasma processing apparatus, it is possible to perform etching on Si used as a to-be-processed object 15 for about 120 seconds, for example, under a condition where as gas, He gas and $SF_6$ gas are supplied to the gas flow channels 7 at 1000 sccm and 400 sccm, respectively, and a high-frequency electric power of 100 W is supplied thereto.

However, the plasma processing apparatus and method described as a conventional example have two issues. The first issue is as follows. That is, when a groove is formed in a to-be-processed portion of a to-be-processed object 15 through etching, the shape of the resultant groove does not have excellent verticality. The second issue is as follows. When the etching depth of the to-be-processed portion in the to-be-processed object 15 reaches a certain value, the etching is interrupted halfway therethrough. FIG. 20 illustrates one example of an etching shape resulted from processing for 120 seconds under the aforementioned plasma condition.

FIG. 20 is a cross-sectional view of the etching shape of a groove portion, wherein various parameters for evaluation of the etching shape are defined as follows. In assuming that the distance between the deepest portion of the groove portion and the surface W of the to-be-processed object is the etching depth Y, the position shallower than the pattern bottom by Y×0.8 is β1, the line width at the depth is defined as the line width X1 of the upper end portion of the groove portion, the position shallower than the pattern bottom by Y×0.2 is β2, and the line width at the depth is defined as the line width X2 of the bottom portion of the etched portion. Further, an angle α indicating the verticality is defined as the angle between the straight line β between β1 and β2 to each other and the surface W of the to-be-processed object.

Referring to FIG. 20, in performing a fine process with a depth on the order of several hundreds micrometers, the etching depth Y is 124 μm, the line width X1 of the upper end portion of the groove portion is 542 μm, and the line width X2 of the bottom portion of the groove portion is 214 μm. Accordingly, the angle α indicating the verticality of the shape of the groove portion is 24.3° (note that the transversal axis and the vertical axis in the figure have different orders). The equation for calculating the angle α is as follows.

$$\alpha = \text{Arctan}(2 \cdot (0.8Y - 0.2Y)/(X1 - X2))$$

FIG. 21 illustrates the dependence of the etching depth on the etching time. As can be seen from the figure, the etching was interrupted at an etching depth of about 280 μm in the depthwise direction.

In view of the aforementioned issues in the conventional art, it is an object of the present invention to provide plasma processing apparatus and method which are capable of applying plasma processes to desired to-be-finely-processed portions (to-be-processed portions) with depths on the order of several hundreds nanometers to several hundreds micrometers to provide etching shapes with excellent verticality without causing interruption of etching in the depthwise direction.

SUMMARY OF THE INVENTION

In order to attain the aforementioned object, the present invention is structured as follows.

According to a first aspect of the present invention, there is provided a plasma processing apparatus comprising:

a plasma source including a gas flow channel formed therein and an electrode which is fed with electric power or grounded to be maintained at a controlled electric potential, a first gas ejecting surface of the plasma source including an opening portion of a first gas ejecting port for ejecting a first gas for causing electric discharge being placed in parallel to a to-be-processed object; and a first gas supplying device connected to said first gas ejecting port of said plasma source for supplying said first gas from said first gas ejecting port to a gap between a first gas ejecting surface of said plasma source and a to-be-processed portion of said to-be-processed object, wherein said plasma source has a convex portion at a portion of a surface opposing to said to-be-processed object, said first gas ejecting surface of said plasma source including the opening portion of said first gas ejecting port is formed at said convex portion and said convex portion has a size which can be inserted into a to-be-finely-processed portion of said to-be-processed object.

According to a second aspect of the present invention, there is provided the plasma processing apparatus according to the first aspect, wherein said convex portion has a size which can be inserted into a to-be-finely-processed portion with a depth on order of several hundreds nanometers to several hundreds micrometers, in said to-be-processed object.

According to a third aspect of the present invention, there is provided the plasma processing apparatus according to the first aspect, wherein a second gas ejecting port for ejecting a second gas for suppressing electric discharge is provided at a different position from said first gas ejecting surface of said plasma source, and the apparatus further comprises a second gas supplying device connected to said second gas ejecting port for supplying said second gas from said second gas ejecting port to a periphery of a gap between a second gas ejecting surface of said plasma source and the to-be-processed portion of said to-be-processed object.

According to a fourth aspect of the present invention, there is provided the plasma processing apparatus according to the first aspect, further comprising an inter-electrode gap adjusting device for moving said plasma source and said to-be-processed object relative to each other such that said gap between said first gas ejecting surface of said plasma source and the to-be-processed portion of said to-be-processed object is maintained within a certain range.

According to a fifth aspect of the present invention, there is provided the plasma processing apparatus according to the first aspect, wherein a counter electrode, which is fed with electric power or grounded to be maintained at a controlled electric potential and can place the to-be-processed object thereon, is provided at a position opposing to the surface of said plasma source including the opening portion of said first gas ejecting port.

According to a sixth aspect of the present invention, there is provided the plasma processing apparatus according to the first aspect, wherein said plasma source has a multi-layer construction that is constituted from two or more laminated layers including patterns formed therein, the patterns constitute said gas flow channels, said gas flow channels in the multi-layer construction include spaces as buffer layers, and at least one of the space cross-sectional areas parallel to the opening cross-sectional area of said first gas ejecting port, out of the space cross-sectional areas of said buffer layers, is greater than the opening cross-sectional area of said first gas ejecting port.

According to a seventh aspect of the present invention, there is provided the plasma processing apparatus according to the sixth aspect, wherein said layers including said patterns formed therein are made of a material mainly consisting of Si.

According to an eighth aspect of the present invention, there is provided the plasma processing apparatus according to the first aspect, wherein said first gas ejecting port has a circular opening shape or an elliptical opening shape and said first gas ejecting port has an opening length in a range of 200 nm to 50 μm, at a diameter or a shorter diameter thereof.

According to a ninth aspect of the present invention, there is provided the plasma processing apparatus according to the first aspect, wherein said first gas ejecting port has a polygonal opening shape and said first gas ejecting port has an opening length in a range of 200 nm to 50 μm, at a single side or one or more diagonal lines thereof.

According to a 10th aspect of the present invention, there is provided the plasma processing apparatus according to the third aspect, wherein said second gas ejecting port has a circular opening shape or an elliptical opening shape and said second gas ejecting port has an opening length in a range of 200 nm to 50 μm, at a diameter or a shorter diameter thereof.

According to an 11th aspect of the present invention, there is provided the plasma processing apparatus according to the third aspect, wherein said second gas ejecting port has a polygonal opening shape and said second gas ejecting port has an opening length in a range of 200 nm to 50 μm, at a single side or one or more diagonal lines thereof.

According to a 12th aspect of the present invention, there is provided a plasma processing method employing a plasma source including a gas flow channel formed therein and an electrode which is fed with electric power or grounded to be maintained at a controlled electric potential, a first gas ejecting surface of said plasma source including an opening portion of a first gas ejecting port for ejecting a first gas for causing electric discharge being placed in parallel to a to-be-processed object, the method comprising:

supplying said first gas to said first gas ejecting port from a first gas supplying device to eject said first gas from said first gas ejecting port toward a gap between a first gas ejecting surface of said plasma source and a to-be-processed portion of said to-be-processed object while supplying electric power to said plasma source, said to-be-processed object or a counter electrode placed on a surface of said to-be-processed object opposite from the to-be-processed portion thereof to generate an electric-potential difference between said plasma source and said to-be-processed object to generate plasma, wherein a plasma process is applied to said to-be-processed portion of said to-be-processed object while a convex portion at a portion of a surface of said plasma source which is faced to said to-be-processed object is inserted into said to-be-processed portion of said to-be-processed object, said first gas ejecting surface of said plasma source including the opening portion of said first gas ejecting port is formed at the convex portion and the convex portion has a size which can be inserted into a to-be-finely-processed portion of said to-be-processed object.

According to a 13th aspect of the present invention, there is provided the plasma processing method according to the 12th aspect, wherein during applying a plasma process to said to-be-processed portion of said to-be-processed object while inserting said convex portion into said to-be-processed portion of said to-be-processed object, the plasma process is applied to said to-be-processed portion of said to-be-processed object while said convex portion is inserted into a to-be-finely-processed portion with a depth on order of several hundreds nanometers to several hundreds micrometers.

According to a 14th aspect of the present invention, there is provided the plasma processing method according to the 12th aspect, wherein a second gas for suppressing electric discharge is ejected from a second gas ejecting port provided at a different position from said first gas ejecting surface of said plasma source to a periphery of the gap between said second gas ejecting surface of said plasma source and the to-be-processed portion of said to-be-processed object.

According to a 15th aspect of the present invention, there is provided the plasma processing method according to the 14th aspect, wherein said second gas is ejected from said second gas ejecting port to the periphery of said gap to apply surface treatment to the side surface portion of said to-be-processed portion of said to-be-processed object.

According to a 16th aspect of the present invention, there is provided the plasma processing method according to the 12th aspect, wherein during applying a plasma process to said to-be-processed portion of said to-be-processed object while inserting said convex portion into said to-be-processed portion of said to-be-processed object, said plasma source and said to-be-processed object are moved relative to each other such that the distance between said first gas ejecting surface of said plasma source and the to-be-processed portion of said to-be-processed object is maintained within a certain range.

According to a 17th aspect of the present invention, there is provided the plasma processing method according to the 12th aspect, wherein the plasma process is performed under a pressure near atmospheric pressure or a pressure equal to or higher than the atmospheric pressure.

With the plasma processing apparatus and method according to the present invention, it is possible to apply plasma processes to desired to-be-processed portions such as to-be-finely-processed portions with depths on the order of several hundreds nanometers to several hundreds micrometers to provide etching shapes with excellent verticality without causing interruption of etching in the depthwise direction.

BRIEF DESCRIPTION OF THE DRAWINGS

These and other aspects and features of the present invention will become clear from the following description taken in conjunction with the preferred embodiments thereof with reference to the accompanying drawings, in which:

FIG. 10 is a view illustrating a list of etching shape data of etching grooves, which are to-be-processed portions, resulted from processing by the plasma processing apparatuses employed in the first, second, third, fourth, fifth, and seventh embodiments and a sixth and an eighth embodiments of the present invention;

DETAILED DESCRIPTION OF THE PREFERRED EMBODIMENTS

Figure 1:
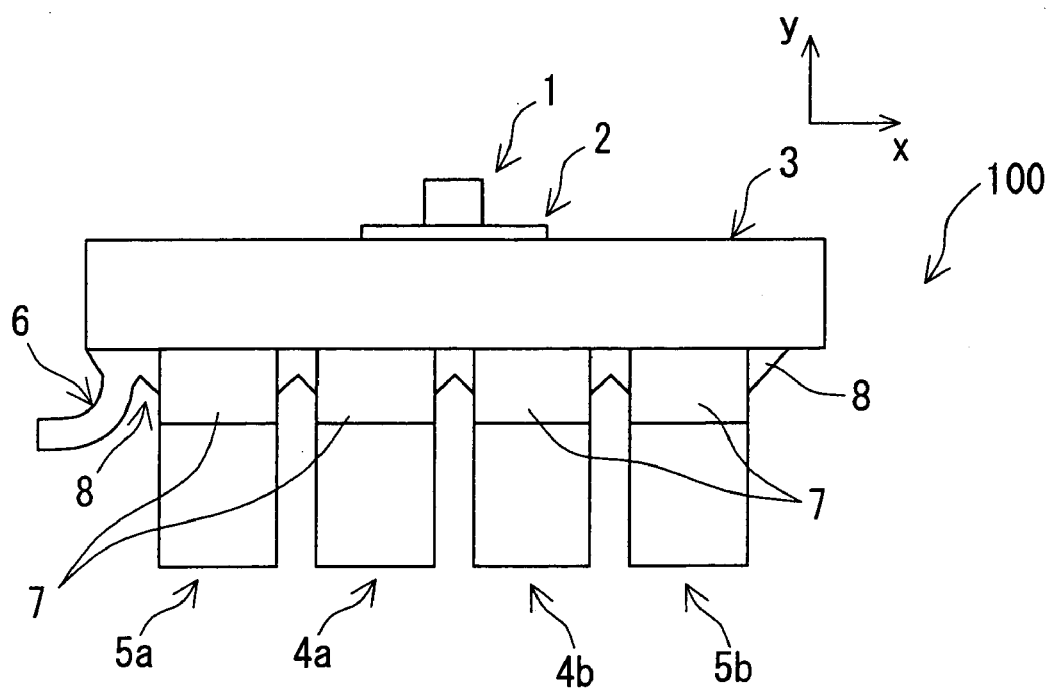
FIG. 1 is an external structural drawing of a plasma processing apparatus employed in a first embodiment of the present invention.

Before the description of the present invention proceeds, it is to be noted that like parts are designated by like reference numerals throughout the accompanying drawings.

Prior to descriptions of embodiments of the present invention, describing various aspects of the present invention and effects and advantages thereof.

A plasma processing apparatus according to an aspect of the present invention is characterized by comprising a plasma source comprising a gas flow channel inside thereof and an electrode which is fed with electric power or grounded to be maintained at a controlled electric potential, a surface of the plasma source including an opening portion of a first gas ejecting port being placed substantially in parallel to a position at which a to-be-processed object can be placed and the plasma processing apparatus being connected to a gas supplying device through a gas supplying port, characterized in that the plasma source has a multi-layer construction that is constituted from two or more laminated layers including patterns formed therein, the gas flow channels inside the multi-layer construction have spaces as buffer layers, and a cross sectional area of at least one space parallel to a cross sectional area of the opening of the first gas ejecting port, out of the cross sectional areas of the spaces of the buffer layers, is greater than the cross-sectional area of the opening of the first gas ejecting port.

With the aforementioned configuration, it is possible to uniformize the gas ejection within the surface including the first gas ejecting port, thereby generating uniform plasma within the surface. This enables applying a plasma process to the to-be-processed object without forming an unrequited taper shape at the bottom portion of the to-be-processed object, which can realize a plasma processing apparatus which is capable of providing etching shapes with excellent verticality at desired to-be-finely-processed portions and is less prone to etching interruption in the depthwise direction.

Also, in the plasma processing apparatus according to an aspect of the present invention, it is preferable that second gas ejecting port is provided at a position different from the surface including the opening portion of the first gas ejecting port.

With the aforementioned configuration, it is possible to suppress the generation of plasma at the side surface portion of the to-be-processed object, which can realize a plasma processing apparatus capable of easily providing etching shapes with excellent verticality at desired to-be-finely-processed portions.

Also, the plasma processing apparatus according to an aspect of the present invention preferably includes a moving mechanism capable of adjusting the distance between the plasma source and the to-be-processed object and the distance between the plasma source and the counter electrode.

With the aforementioned configuration, it is possible to maintain the distance between the plasma source and the bottom portion of the to-be-processed object at a substantially constant value, thereby realizing a plasma processing apparatus less prone to etching interruptions in the depthwise direction at desired to-be-finely-processed portions.

Also, the plasma processing apparatus according to an aspect of the present invention preferably includes a counter electrode which can be fed with electric power or grounded to be maintained at a controlled electric potential and can place the to-be-processed object thereon, at a position opposing to the surface of the plasma source including the opening portion of the first gas ejecting port.

With the aforementioned configuration, it is possible to efficiently increase the voltage generated between the plasma source and the bottom portion of the to-be-processed portion of the to-be-processed object, thereby suppressing the generation of plasma on the plasma source and the side surface portions of the to-be-processed portion of the to-be-processed object. This can realize a plasma processing apparatus capable of easily providing etching shapes with excellent verticality at desired to-be-finely-processed portions.

Also, in the plasma processing apparatus according to an aspect of the present invention, preferably, the plasma source has a convex shape at a portion thereof such that the distance between the surface of the plasma source including the opening portion of the first gas ejecting port and the to-be-processed object and the distance between the surface of the plasma source including the opening portion of the first gas ejecting port and the counter electrode become minimized.

With the aforementioned configuration, it is possible to maintain the distance between the plasma source and the bottom portion of the to-be-processed object at a substantially constant value, thereby realizing a plasma processing apparatus less prone to etching interruptions in the depthwise direction at desired to-be-finely-processed portions.

Also, in the plasma processing apparatus according to an aspect of the present invention, preferably, the patterns formed in the plasma source include at least a gas flow channel and also include a liquid flow channel.

With the aforementioned configuration, it is possible to cool the plasma source to suppress the transition of generated plasma into arc discharge (spark), thereby enabling applying a plasma process to the to-be-processed object without causing unrequited oxidation of the bottom portion of the to-be-processed object. This can realize a plasma processing apparatus which is less prone to etching interruption in the depthwise direction at desired to-be-finely-processed portions.

Further, in the plasma processing apparatus according to an aspect of the present invention, preferably, the layer including the pattern formed therein is made of a material having a volume resistivity of $10^{-1}$ Ω·cm or less.

With the aforementioned configuration, it is possible to reduce the electric power loss at portions other than the portion subjected to a desired load, which can suppress the occurrence of unnecessary heat or can eliminate the difficulty of matching with the desired load.

Further, in the plasma processing apparatus according to an aspect of the present invention, preferably, the layer including the pattern formed therein is made of a material mainly consisting of Si.

With the aforementioned configuration, since such a material is relatively inexpensive and has excellent processability and also the electrical conductivity of the material can be controlled, which enables controlling the voltage generated between the plasma source and the bottom portion of the to-be-processed portion of the to-be-processed object, with the configuration of the apparatus.

Further, in the plasma processing apparatus according to an aspect of the present invention, preferably, the surface including the opening portion of the first gas ejecting port is coated with a layer which has a lower etching rate than Si, with respect to halogen-containing gases.

With the aforementioned configuration, it is possible to suppress the wear of the plasma source by plasma-activated species, thereby offering the advantage of increasing the maintenance period of components.

Further, more preferably, the layer having a lower etching rate than Si is a metal material mainly consisting of at least one of Ag, Al, Au, Co, Cr, Cu, Fe, Mg, Mo, Ni, Pt, Ti, Ta, and W; or an insulation material made of an oxide, nitride, or fluoride containing these elements and Si. Since these materials have poorer reactivity with respect to halogen gases than Si, it is possible to suppress the wear of the plasma source by plasma-activated species, thereby offering the advantage of increasing the maintenance period of components.

Further, in the plasma processing apparatus according to an aspect of the present invention, preferably, the pattern and the first gas ejecting port are formed by a plasma etching process under a reduced pressure, an etching process using a chemical, a machining process with electric discharge machining, or a machining process with a laser machining.

With the aforementioned configuration, it is possible to perform patterning with machining dimensions and accuracy which cannot be realized by conventional mechanical machining.

Further, in the plasma processing apparatus according to an aspect of the present invention, preferably, the first gas ejecting port has an opening length that is not less than 200 nm and not more than 50 μm, at the diameter or the shorter diameter thereof, when the first gas ejecting port has a circular opening shape or an elliptical opening shape.

With the aforementioned configuration, it is possible to offer the advantage of improvement of the uniformity of plasma or suppression of the generation of arc discharge (spark), since the uniformity of gas within the surface is improved as the opening length is decreased. However, if the opening length is excessively small, this will increase the difficulty of machining for fabricating the plasma source, and therefore it is preferable the opening length approximately is not less than 200 nm and not more than 50 μm.

Further, in the plasma processing apparatus according to an aspect of the present invention, preferably, the first gas ejecting port has an opening length that is not less than 200 nm and not more than 50 μm, at a single side or one or more diagonal lines thereof, when the first gas ejecting port has a polygonal opening shape.

With the aforementioned configuration, it is possible to offer the advantage of improvement of the uniformity of plasma or suppression of the generation of arc discharge (spark), since the uniformity of gas within the surface is improved as the opening length is decreased. However, if the opening length is excessively small, this will increase the difficulty of machining for fabricating the plasma source, and therefore it is preferable the opening length approximately is not less than 200 nm and not more than 50 μm.

Further, in the plasma processing apparatus according to an aspect of the present invention, preferably, the second gas ejecting port has an opening length that is not less than 200 nm and not more than 50 μm, at the diameter or the shorter diameter thereof, when the second gas ejecting port has a circular opening shape or an elliptical opening shape.

With the aforementioned configuration, it is possible to offer the advantage of improvement of the uniformity of plasma or suppression of the generation of arc discharge (spark), since the uniformity of gas within the surface is improved as the opening length is decreased. However, if the opening length is excessively small, this will increase the difficulty of machining for fabricating the plasma source, and therefore it is preferable the opening length approximately is not less than 200 nm and not more than 50 μm.

Further, in the plasma processing apparatus according to an aspect of the present invention, preferably, the second gas ejecting port has an opening length that is not less than 200 nm and not more than 50 µm, at a single side or one or more diagonal lines thereof, when the second gas ejecting port has a polygonal shape.

With the aforementioned configuration, it is possible to offer the advantage of improvement of the uniformity of plasma or suppression of the generation of arc discharge (spark), since the uniformity of gas within the surface is improved as the opening length is decreased. However, if the opening length is excessively small, this will increase the difficulty of machining for fabricating the plasma source, and therefore it is preferable the opening length approximately is not less than 200 nm and not more than 50 µm.

A plasma processing method according to an aspect of the present invention is a plasma processing method employing a plasma source including a gas flow channel inside thereof and an electrode which can be fed with electric power or grounded to be maintained at a controlled electric potential and places a surface of the plasma source including an opening portion of a first gas ejecting port substantially in parallel to a to-be-processed object and ejects a first gas from the first gas ejecting port toward the to-be-processed object while supplying electric power to the plasma source, the to-be-processed object, or a counter electrode placed on a surface of the to-be-processed object opposite to a to-be-processed surface thereof to generate an electric-potential difference between the plasma source and the to-be-processed portion of the to-be-processed object to generate plasma, characterized in that a gap distance between a surface of the plasma source closest to the to-be-processed portion of the to-be-processed object and the to-be-processed portion of the to-be-processed object is reduced, during a plasma process or before or after the plasma process.

With the aforementioned configuration, it is possible to maintain a distance between the plasma source and a bottom portion of the to-be-processed object at a substantially constant value, which can realize a plasma processing method less prone to etching interruption in the depthwise direction at desired to-be-finely-processed portions.

A plasma processing method according to an aspect of the present invention is a plasma processing method employing a plasma source including a gas flow channel inside thereof and an electrode which can be fed with electric power or grounded to be maintained at a controlled electric potential and places a surface of the plasma source including an opening portion of a first gas ejecting port substantially in parallel to a to-be-processed object and ejects a first gas from the first gas ejecting port toward the to-be-processed object while supplying electric power to the plasma source, the to-be-processed object, or a counter electrode placed on a surface of the to-be-processed object opposite from a to-be-processed surface thereof to generate an electric-potential difference between the plasma source and a to-be-processed portion of the to-be-processed object to generate plasma, characterized in that a cross-sectional area of the to-be-processed object is greater than a cross sectional area of the surface including the opening portion of the first gas ejecting port.

With the aforementioned configuration, it is possible to maintain a distance between the plasma source and a bottom portion of the to-be-processed object at a substantially constant value, which can realize a plasma processing method less prone to etching interruption in the depthwise direction at desired to-be-finely-processed portions.

A plasma processing method according to an aspect of the present invention is a dicing processing method employing a plasma source including a gas flow channel inside thereof and an electrode which can be fed with electric power or grounded to be maintained at a controlled electric potential and places a surface of the plasma source including an opening portion of a first gas ejecting port substantially in parallel to a to-be-processed object and ejects a first gas from the first gas ejecting port toward the to-be-processed object while supplying electric power to the plasma source, the to-be-processed object, or a counter electrode placed on a surface of the to-be-processed object opposite from a to-be-processed surface thereof to generate an electric-potential difference between the plasma source and a to-be-processed portion of the to-be-processed object to generate plasma, characterized in that a gap distance between a surface of the plasma source closest to the to-be-processed portion of the to-be-processed object and the to-be-processed portion of the to-be-processed object is reduced, during a plasma process or before or after the plasma process.

With the aforementioned configuration, it is possible to maintain a distance between the plasma source and a bottom portion of the to-be-processed object at a substantially constant value, which can realize a plasma processing method less prone to etching interruption in a depthwise direction at desired to-be-finely-processed portions.

A plasma processing method according to an aspect of the present invention is a dicing processing method employing a plasma source including a gas flow channel inside thereof and an electrode which can be fed with electric power or grounded to be maintained at a controlled electric potential and places a surface of the plasma source including an opening portion of a first gas ejecting port substantially in parallel to a to-be-processed object and ejects a first gas from the first gas ejecting port toward the to-be-processed object while supplying electric power to the plasma source, the to-be-processed object, or a counter electrode placed on a surface of the to-be-processed object opposite from a to-be-processed surface thereof to generate an electric-potential difference between the plasma source and a to-be-processed portion of the to-be-processed object to generate plasma, characterized in that a cross-sectional area of the to-be-processed object is greater than a cross sectional area of the surface including the opening portion of the first gas ejecting port.

With the aforementioned configuration, it is possible to maintain a distance between the plasma source and a bottom portion of the to-be-processed object at a substantially constant value, which can realize a plasma processing method less prone to etching interruption in a depthwise direction at desired to-be-finely-processed portions.

Further, in the plasma processing method according to the aforementioned aspect of the present invention, preferably, a second gas is ejected toward the to-be-processed object, from a second gas ejecting port provided at a different position from the surface including the opening portion of the first gas electing port.

With the aforementioned configuration, it is possible to suppress the generation of plasma at the side surface portions of the to-be-processed object, which can realize a plasma processing method capable of easily providing etching shapes with excellent verticality, at desired to-be-finely-processed portions.

More preferably, a second gas is ejected toward the to-be-processed object, from a second gas ejecting port provided at a different position from the surface including the opening portion of the first gas electing port to apply a desired surface modification to a side surface portion of the to-be-processed surface of the to-be-processed object.

With the aforementioned configuration, it is possible to suppress the generation of plasma at the side surface portions of the to-be-processed object or even in the event of the generation of plasma thereat, it is possible to reduce the etching rate at the side surface portions of the to-be-processed object, which can realize a plasma processing method capable of easily providing etching shapes with excellent verticality, at desired to-be-finely-processed portions.

More preferably, the desired surface treatment is any one of fluoriding, nitriding, or oxidation.

With the aforementioned configuration, it is possible to suppress the generation of plasma at the side surface portions of the to-be-processed object or even in the event of the generation of plasma thereat, it is possible to reduce the etching rate at the side surface portions of the to-be-processed object, which can realize a plasma processing method capable of easily providing etching shapes with excellent verticality, at desired to-be-finely-processed portions.

In the plasma processing method according to the aforementioned aspect of the present invention, preferably, the first gas contains at least one of He, Ar, Kr, Ne, and Xe, and a total content of these five gases is 80% or more, as a partial pressure.

With the aforementioned configuration, it is possible to suppress the generation of arc electric discharge (spark), thereby enabling applying a plasma process to the to-be-processed object without causing the oxidation of the bottom portion thereof. This can realize a plasma processing method less prone to etching interruption in the depthwise direction, at desired to-be-finely-processed portions.

In the plasma processing method according to the aforementioned aspect of the present invention, preferably, the first gas contains at least one of $SF_6$; CxFy (x and y are natural numbers) such as $CF_4$; halogen-containing gases such as $NF_3$, $Cl_2$, and HBr; $N_2$; air; and $O_2$ gas.

With the aforementioned configuration, it is possible to offer the advantage of increase of the processing speed.

With the plasma processing method according to the aforementioned aspect of the present invention, preferably, the second gas contains at least one of $SF_6$, CxFy (x and y are natural numbers) such as $CF_4$, $NF_3$, a fluorine-containing gas, $N_2$, and $O_2$ gases and, the total content of these gases is 90% or more as a partial pressure.

With the aforementioned configuration, it is possible to suppress the generation of plasma at the side surface portions of the to-be-processed object or even in the event of the generation of plasma thereat, it is possible to reduce the etching rate at the side surface portions of the to-be-processed object, which can realize a plasma processing method capable of easily providing etching shapes with excellent verticality, at desired to-be-finely-processed portions.

Further, in the plasma processing method according to the aforementioned aspect of the present invention, preferably, the plasma process is an etching process of the to-be-processed object.

In the case of an etching process, significant effects can be expected.

Further, in the plasma processing method according to the aforementioned aspect of the present invention, preferably, the plasma process is performed under a pressure near the atmospheric pressure or a pressure equal to or higher than the atmospheric pressure.

With the aforementioned configuration, it is possible to eliminate a vacuum transferring operation or other operations, thereby offering various advantages such as improvement of the production cycle time (takt time), the reduction of the cost of the apparatus.

Further, in the plasma processing method according to the aforementioned aspect of the present invention, preferably, the form of plasma is so-called glow electric discharge, in terms of current-voltage characteristics.

With the aforementioned configuration, it is possible to suppress the gas temperature rise while maintaining a certain degree of processing speed, thereby offering the advantage of continuing the plasma process without thermally damaging the to-be-processed object.

As described above, with the plasma processing apparatus and method according to the present invention, it is possible to apply plasma processes to desired to-be-finely-processed portions (to-be-processed portions) with depths on the order of several hundreds nanometers to several hundreds micrometers to provide etching shapes with excellent verticality without causing interruption of etching in the depthwise direction.

Hereinafter, embodiments of the present invention will be described with reference to the drawings.

First Embodiment

Hereinafter, with reference to FIG. 1 to FIG. 8, a first embodiment of the present invention will be described. FIG. 1 and FIGS. 2A to 2C illustrate external structural views of a plasma processing apparatus incorporating a plasma source 100 according to the present invention.

Referring to FIG. 1, the plasma source 100 of the plasma processing apparatus is constituted by three laminated members 1, 2, and 3 having respective squire planes, a first gas pipe 4a, a second gas pipe 4b, a feed-water pipe 5a, a drain pipe 5b, a conductive wire 6, and four insulation pipes 7, wherein the wire 6 and the four insulation pipes 7 are connected to the third laminated member 3 via an adhesive 8.

Figure 2A:
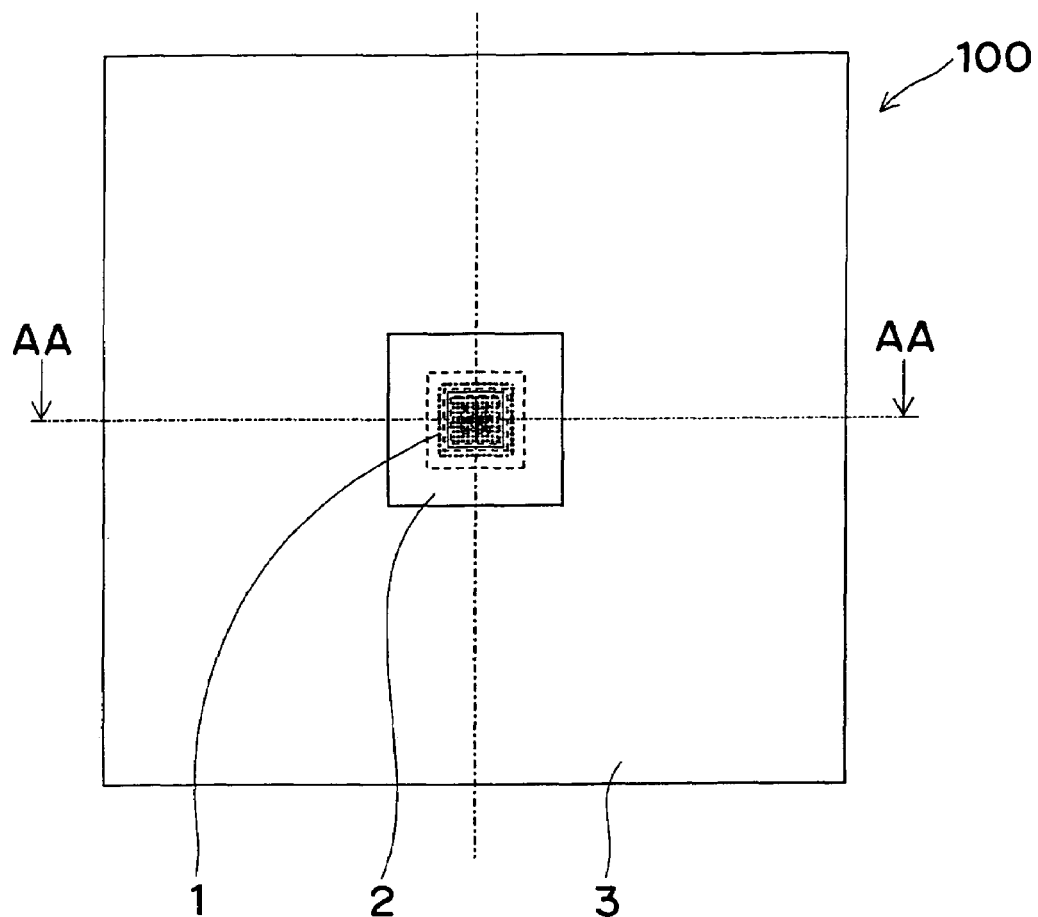
FIG. 2A is an enlarged plan view of the plasma processing apparatus employed in the first embodiment of the present invention.
Figure 2B:
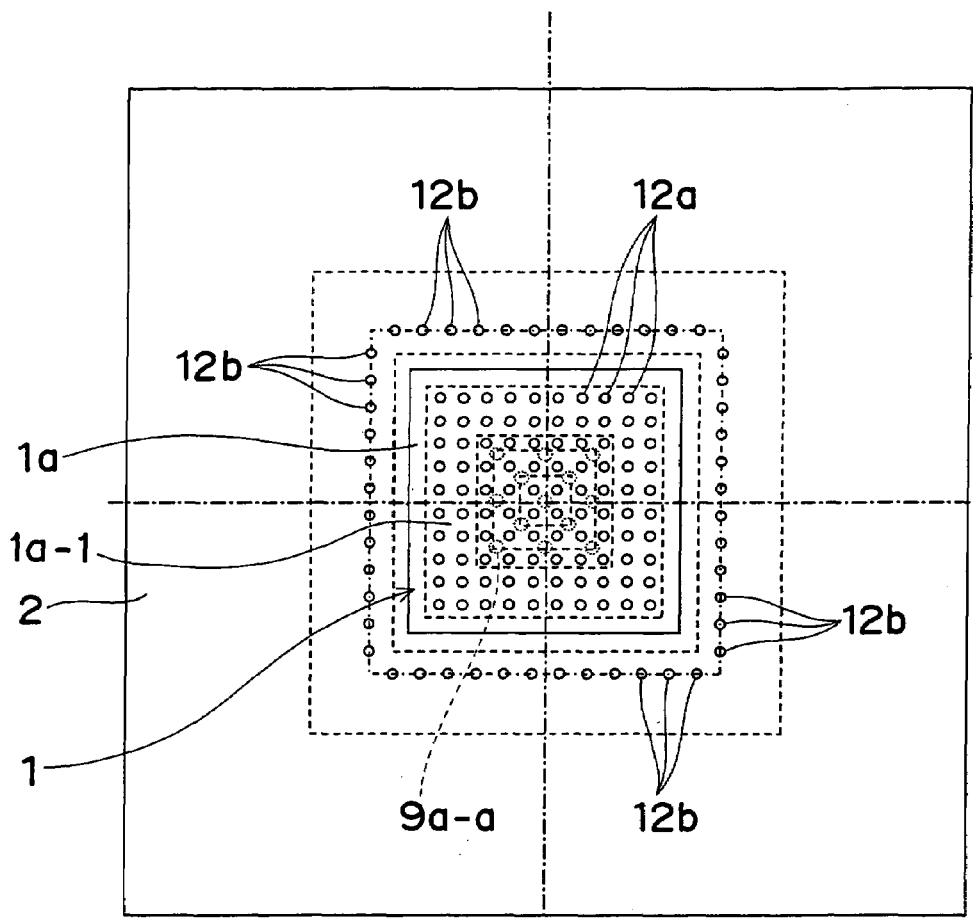
FIG. 2B is an enlarged plan view of the plasma source of the plasma processing apparatus employed in the first embodiment of the present invention.
Figure 2C:
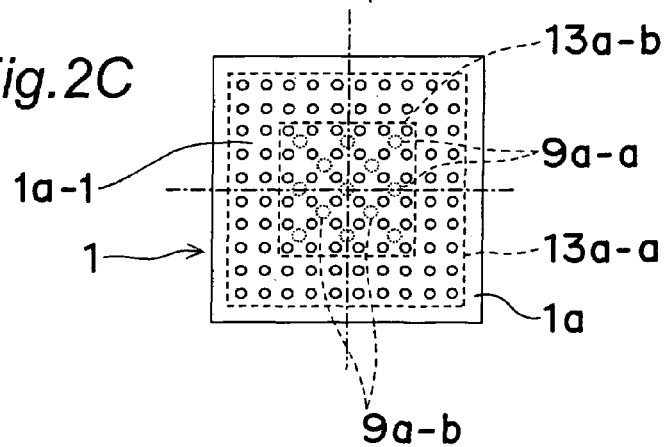
FIG. 2C is an enlarged plan view of the end surface of the plasma source of the plasma processing apparatus employed in the first embodiment of the present invention.
Figure 3:
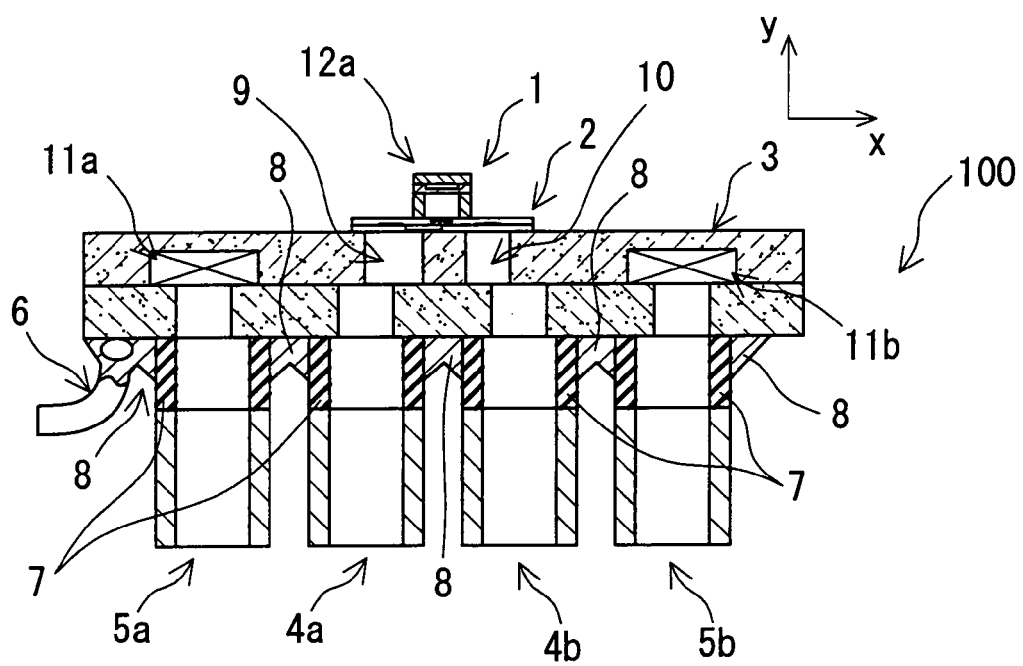
FIG. 3 is a cross-sectional view of an external structural drawing of the plasma processing apparatus employed in the first embodiment of the present invention.

As described above, the plasma processing apparatus is mainly constituted by the three laminated members, namely the first, second, and third laminated members 1, 2, and 3, and has a convex shape in the y direction, wherein the plasma processing apparatus is designed such that a distance between a to-be-processed object 15 and a tip end portion of the convex shape, which is a tip end surface of the first laminated member 3 constituting the convex portion is smaller than distances between the to-be-processed object 15 and various other portions of the plasma source 100 that face the to-be-processed object 15. FIG. 2A to FIG. 2C illustrate enlarged plan view from above FIG. 1. FIG. 3 illustrates a cross-sectional view taken along the plain AA-AA in FIG. 2A.

FIG. 3 illustrates the three laminated members, namely the first, second, and third laminated members 1, 2, and 3, the first gas pipe 4a, the second gas pipe 4b, the feed-water pipe 5a, the drain pipe 5b, the conductive wire 6, and the four insulation pipes 7, as similar to FIG. 1. The first, second, and third laminated members 1, 2, and 3 are coupled to one another such that first gas flow channels 9 respectively formed in the second and third laminated members 2 and 3 are communicated with each other and also eleventh gas flow channels 10 respectively formed in the first, second, and third laminated members 1, 2, and 3 are also communicated with one another. The first gas pipe 4a and the second gas pipe 4b are communicated with the first gas flow channel 9 and the eleventh gas flow channel 10 in the third laminated member 3 through the insulation pipe 7 and the insulation pipe 7, respectively. The feed-water pipe 5a and the drain pipe 5b are coupled to water channels 11a and 11b formed in the third laminated member 3 through the insulation pipe 7 and the insulation pipe 7. Further, the water channels 11a, 11b are communicated with each other within the third laminated member 3. The first gas pipe 4a, the second gas pipe 4b, the feed-water pipe 5a, and the drain pipe 5b have an outer diameter Φ of 1/16 inch, for example.

Figure 4:
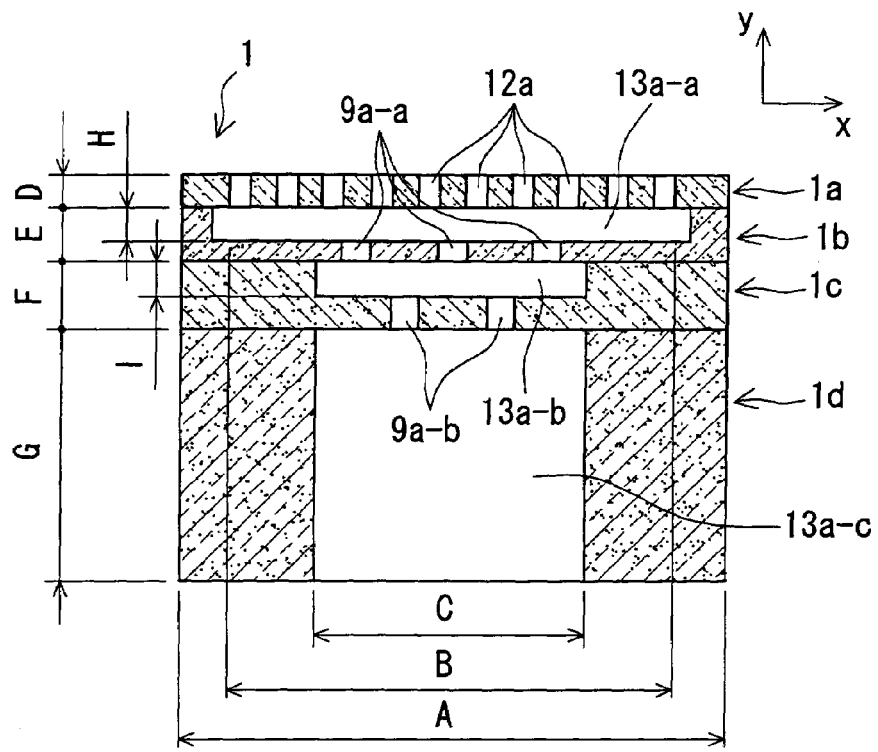
FIG. 4 is a cross-sectional view of the first laminated member in the plasma processing apparatus employed in the first embodiment of the present invention.

FIG. 4 illustrates a cross-sectional view of the first laminated member 1. FIG. 2B and FIG. 2C illustrate an enlarged plan view of the first laminated member 1 and the second laminated member 2 and an enlarged plan view of the first laminated member 1, respectively. The first laminated member 1 of FIG. 4 has a four-layer construction that is constituted from a first layer 1a, a second layer 1b, a third layer 1c, and a fourth layer 1d, wherein several tens of first gas ejecting ports 12a are provided through the surface of the first layer 1a which is faced to the to-be-processed object 15, namely a first gas ejecting surface 1a-1, preferably at even intervals, in order to enable evenly ejecting a first gas through the first gas ejecting surface 1a-1. Further, the second layer 1b is provided with a first buffer layer 13a-a communicated with all the first gas ejecting ports 12a and plural second gas flow channel 9a-a which are all communicated with the first buffer layer 13a-a and are penetrated through the second layer 1b. Further, the third layer 1c is provided with a second buffer layer 13a-b communicated with all the second gas flow channels 9a-a and plural third gas flow channels 9a-b which are all communicated with the second buffer layer 13a-b and penetrated through the third layer 1c. The fourth layer 1d is provided with a third buffer layer 13a-c communicated with all the third gas flow channels 9a-b. As one example, in FIG. 4, the length A of the first layer 1a, the second layer 1b, the third layer 1c, and the fourth layer 1d in the x direction (the length of a single side of the first laminated member 1 having a square plan shape) is 800 μm, the length B (the length of a single side of the square-shaped region of the first laminated member 1 over which the first gas electing ports 12a are formed) is 700 μm, and the length C (the length of a single side of the buffer layer 13a-c having a square plain shape in the first laminated member 1) is 400 μm. The thickness D of the first layer 1a in the y direction is 50 μm, the thickness E of the second layer 1b in the y direction is 80 μm, the thickness F of the third layer 1c in the y direction is 100 μm, the thickness G of the fourth layer 1d in the y direction is 370 μm, the thickness H of the first buffer layer 13a-a is 50 μm and the thickness I of the second buffer layer 13a-b is 50 μm. Further, as an example, the layers 1a, 1b, 1c, and 1d are made using Si. Also, as an example, each of the first gas ejecting ports 12a has an opening diameter of Φ30 μm.

The opening portions of the aforementioned first gas ejecting ports are not provided in the surfaces of the aforementioned plasma source 100 which are faced with the to-be-processed object 15 other than the aforementioned convex portion. As will be described later, only the aforementioned convex portion can be inserted into to-be-finely-processed portions of the to-be-processed object 15 which have depths on the order of several hundreds nanometers to several hundreds micrometers, and the convex portion has a height greater than the processing depth of the to-be-processed object 15. Here, the height of the convex portion should be greater than the desired processing depth (the processing depth resulted from processing) of the to-be-processed object 15. Namely, where the desired processing depth of the to-be-processed object 15 is Y, and NN is the height of the convex portion (NN=D+E+F+G, in FIG. 4), it is desirable that a relation NN≧Y+100 μm is established. The value 100 μm is set here, because, if the gap distance between the surface including second gas ejecting ports 12b formed therein, which will be described later, and the to-be-processed portion of the to-be-processed object 15 is less than 100 μm, there will be provided a significantly small space between the surface of the second laminated member 2 including the second gas ejecting ports 12b formed therein and the proximity portion of the desired to-be-processed portion of the to-be-processed object 15, which will prevent the second gas from sufficiently reaching to the proximity portion of the desired to-be-processed portion. Further, since the first laminated member 1 has a laminated-layer construction that is constituted from two or more layers, it is preferable that the height NN of the convex portion constituted by the first laminated member 1 is substantially equal to or greater than 100 μm. This is for the following reason. That is, when the respective layers constituting the first laminated member 1 are made of Si, it is preferable that each single Si layer has a thickness equal to or greater than about 50 μm, in order to enable dicing the Si substrates forming the respective layers into a chip size or attaching the chips forming the respective layers to one another to form the first laminated member 1.

As illustrated in FIG. 4, the cross sectional areas of the respective openings of the first gas ejecting ports 12a are made smaller than the cross sectional area of the space of the first buffer layer 13a-a which is parallel to the aforementioned cross sectional areas, in order to improve the uniformity of the flow rates of ejected gas across the first gas ejecting surface 1a-1 including the opening portions of the first gas ejecting ports 12a. In actual, as one example, the cross sectional area of the openings of the first gas ejecting ports 12a (having a round shape with a radius of 15 μm) is set to 706 μm2, while the cross sectional area of the space of the first buffer layer 13a-a (having a square shape with a side length of 750 μm) which is parallel to the aforementioned cross-sectional area is set to 562500 μm2.

Further, it is preferable that there is substantially the following relationship; PP/QQ<1, between the first and second buffer layers 13a-a, 13a-b and the diameter of the first gas ejecting ports 12a, wherein PP is the heights of the first and second buffer layers 13a-a and 13a-b in the plain parallel to the direction of gas ejection towards the to-be-processed object 15 (the heights H and I in the plain parallel to the x-y plain in FIG. 4) and QQ is the opening diameter (not shown) of the first gas ejection ports 12a. With the aforementioned designing, gas introduced into the first and second buffer layers 13a-a and 13a-b can be sufficiently spread over the first and second buffer layers 13a-a and 13a-b, which can equalize the flow rates of gas ejected from the respective gas ejecting ports 12a, thus evenly supplying gas over the surface.

Figure 5:
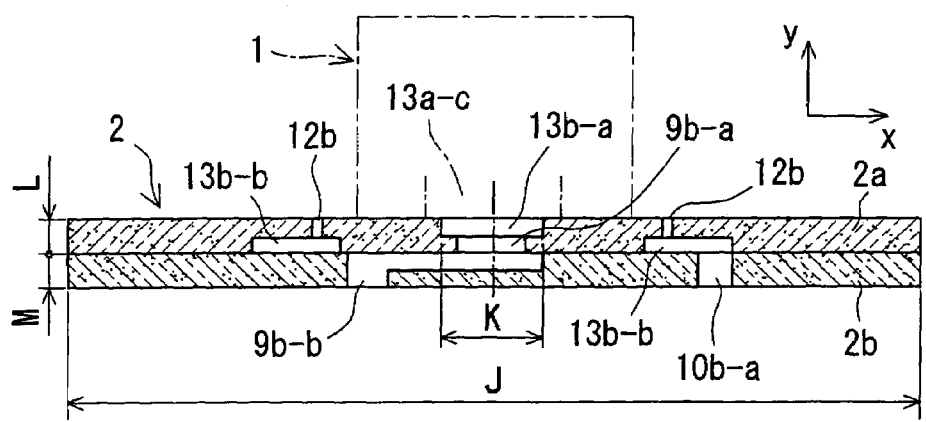
FIG. 5 is a cross-sectional view of the second laminated member in the plasma processing apparatus employed in the first embodiment of the present invention.

FIG. 5 illustrates a cross-sectional view of the second laminated member 2. In FIG. 5, the second laminated member 2 has a two-layer construction that is constituted by layers 2a and 2b. The layer 2a is provided, at the center portion thereof, with a fourth gas flow channel 9b-a continuous with a fourth buffer layer 13b-a which can communicate with the third buffer layer 13a-c of the first laminated member 1 and also is provided with second gas ejecting ports 12b continuous with a fifth buffer layer 13b-b around the fourth gas flow channel 9b-a. As one example, as illustrated in FIG. 2B, the second gas ejecting ports 12b are evenly placed in a line around the first laminated member 1 in a rectangular frame shape, in order to enable ejecting the second gas substantially in a rectangular cylindrical shape which surrounds all the side surfaces of the first laminated member 1 and reaches the periphery of the first gas ejecting surface 1a-1 of the first laminated member 1 that includes the opening portions of the first gas ejecting ports 12a. Further, the layer 2b is provided with a fifth gas flow channel 9b-b which can communicate with the fourth gas flow channel 9b-a and a twelfth gas flow channel 10b-a. For example, the length J of the second laminated member 2 that is constituted from the two layers 2a and 2*b* in the x direction is 2.5 mm, the length K of the fourth buffer layer 13*b-a* in the x direction is 300 μm, and the thicknesses L and M of the respective layers 2*a* and 2*b* in the y direction are both 100 μm. As one example, the layers 2*a* and 2*b* are made of Si. Further, as one example, each of the second gas ejecting ports 12*b* has an opening diameter of Φ30 μm.

Further, the second gas flow channel 9*a-a*, the third gas flow channel 9*a-b*, the fourth gas flow channel 9*b-a*, and the fifth gas flow channel 9*b-b* constitute the aforementioned first gas flow channel 9. Further, the twelfth gas flow channel 10*b-a*, a thirteenth gas flow channel 10*c-a*, and a fourteenth gas flow channel 10*c-b* constitute the aforementioned eleventh gas flow channel 10.

Figure 6:
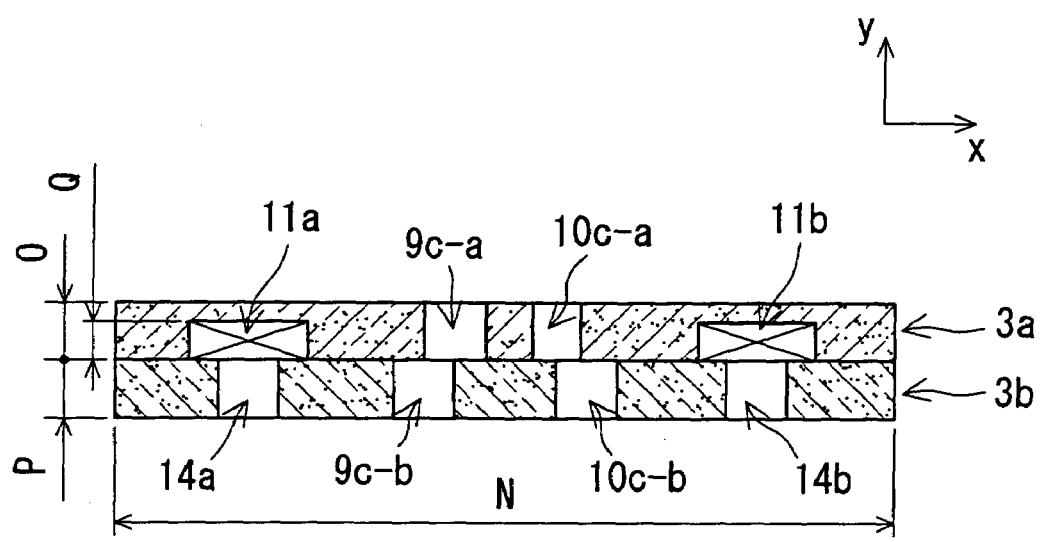
FIG. 6 is a cross-sectional view of the third laminated member in the plasma processing apparatus employed in the first embodiment of the present invention.

FIG. 6 illustrates a cross-sectional view of the third laminated member 3. In FIG. 6, the third laminated member 3 has a two-layer construction that is constituted from layers 3*a* and 3*b*. The layer 3*a* is provided with a sixth gas flow channel 9*c-a* which can communicate with the fifth gas flow channel 9*b-b*, a thirteenth gas flow channel 10*c-a* which can communicate with the twelfth gas flow channel 10*b-a*, and water channels 11*a* and 11*b* not open on the second laminated member side. The layer 3*b* is provided with a seventh gas flow channel 9*c-b* which can communicate with the sixth gas flow channel 9*c-a*, a fourteenth gas flow channel 10*c-b* which can communicate with the thirteenth gas flow channel 10*c-a*, a feed-water channel 14*a* continuous with the water channel 11*a*, and a drain channel 14*b* continuous with the water channel 11*b*. As one example, the length N of the third laminated member 3 in the x direction is 10 mm, the thicknesses O and P of the respective layers 3*a* and 3*b* in the y direction are both 760 μm, and the thickness Q of the water channels 11*a* and 11*b* in the y direction is 500 μm. As one example, the layers 3*a* and 3*b* are made of Si.

Further, in fabricating the plasma source 100 of the aforementioned plasma processing apparatus, as one example, a room-temperature bonding technique is employed for bonding the respective layers. In this case, the room-temperature bonding technique is a technique for applying a reduced-pressure plasma process to the bonding surfaces (namely, each of the opposing bonding surfaces of two layers to be bonded to each other) of to-be-bonded materials made of, for example, Si, then bringing the plasma-processed bonding surfaces of the Si into contact with each other while maintaining the reduced pressure, and then mechanically applying a stress thereto such that their bonding surfaces contact each other for bonding.

Further, as the Si used for the layers 1*a*, 1*b*, 1*c*, 1*d*, 2*a*, 2*b*, 3*a*, and 3*b*, Si having a volume resistivity of $10^{-2}$ Ω·cm is employed, in order to ensure a certain degree of electrical conductivity. If its volume resistivity is greater than $10^{-2}$ Ω·cm, the consumption by heat increases, resulting in poor efficiency, and significant temperature rises is caused in the Si, resulting in exfoliation of the bonding surfaces.

The aforementioned plasma source 100 is operable within the pressure range of from several Pa to several atmospheric pressures and, typically, is operated within the pressure range of about 10000 Pa to three atmospheric pressures. Particularly, operations under pressures near the atmospheric pressure are particularly preferable, since such operations require no stringent sealing structure and no specific gas exhausting device and also can properly suppress the diffusion of plasma and activated particles.

Figure 7A:
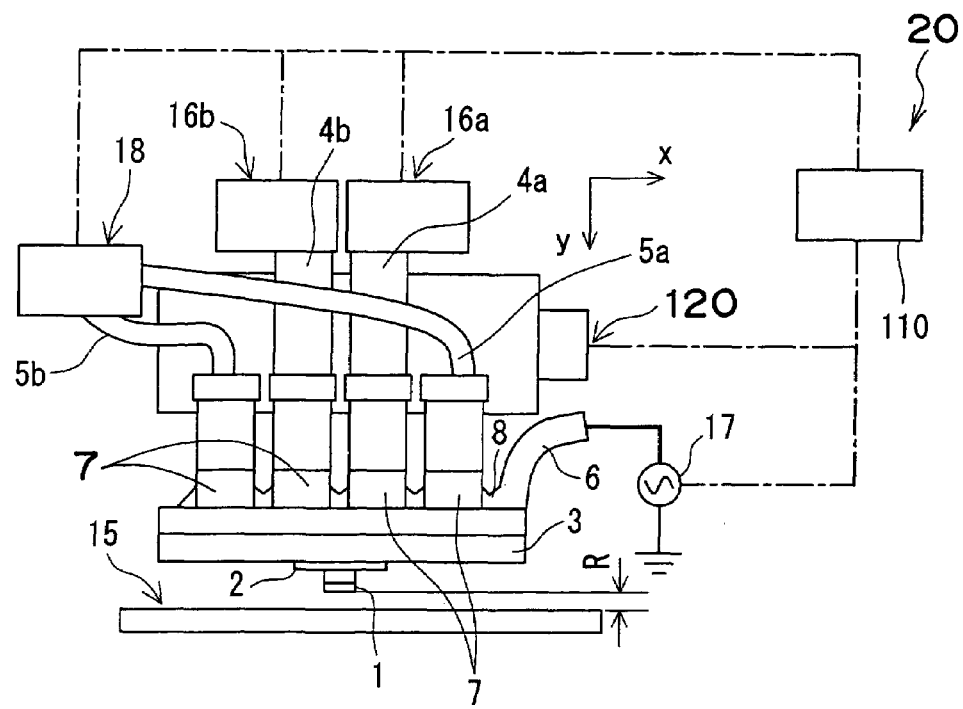
FIG. 7A is an external view of a plasma processing apparatus employed in the first embodiment, a third embodiment, a fourth embodiment, a fifth embodiment, and a seventh embodiment of the present invention.
Figure 7B:
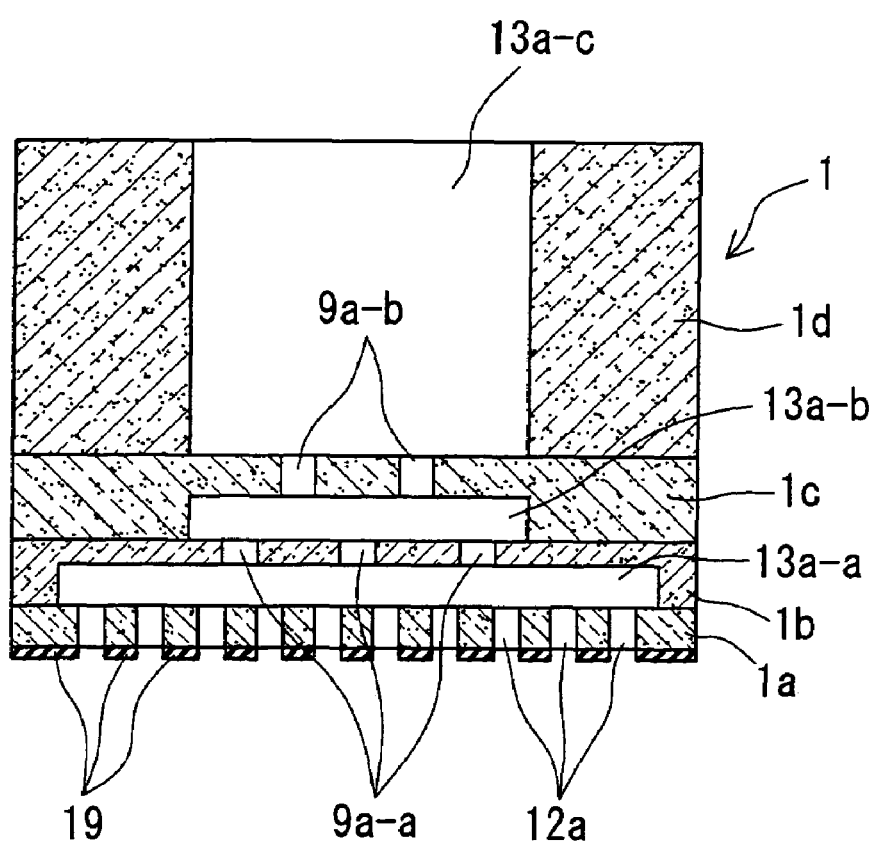
FIG. 7B is a partial enlarged cross-sectional view of the plasma source in the plasma processing apparatus employed in the first embodiment, the third embodiment, the fourth embodiment, the fifth embodiment, and the seventh embodiment of the present invention.

FIG. 7A illustrates the entire plasma processing apparatus including the aforementioned plasma source 100, and FIG. 7B is an enlarged cross-sectional view of the plasma source 100. The plasma processing apparatus includes a first gas supplying device 16*a*, a second gas supplying device 16*b*, a high-frequency power supply 17, a constant-temperature water circulating device 18, an inter-electrode gap adjusting mechanism 120, and a controlling device 110, in addition to the aforementioned plasma source 100.

The first gas supplying device 16*a* is connected to the first gas pipe 4*a* so that He as one example of inert gas and $CF_4$ as one example of reactive gas can be supplied as one example of electrically-discharging gas (first gas) from the first gas supplying device 16*a* to the first gas flow channel 9 through the first gas pipe 4*a*.

The second gas supplying device 16*b* is connected to the second gas pipe 4*b* so that $O_2$ as one example of electrical-discharge suppressing gas (second gas) can be supplied from the second gas supplying device 16*b* to the eleventh gas flow channel 10 through the second gas pipe 4*b*.

The high-frequency power supply 17 is connected to the conductive wire 6 for supplying high-frequency electric power to the plasma source 100.

The constant-temperature water circulating device 18 is connected to the feed-water pipe 5*a* and the drain pipe 5*b* so that cooling water can be fed and exhausted to or from the third laminated member 3 through the feed-water pipe 5*a* and the drain pipe 5*b*.

The inter-electrode gap adjusting mechanism 120 is capable of supporting the plasma source 100 with respect to the to-be-processed object 15 movably in the direction of access/separation (in the y direction) (preferably, movably both in the aforementioned direction of access/separation (in the y direction) and in the direction orthogonal to the aforementioned direction of access/separation (in the x direction)) and also is capable of adjusting the distance between the tip end surface of the plasma source 100 (the first gas ejecting surface 1*a*-1 of the first laminated member 1 including the opening portions of the first gas ejecting ports 12*a*) and the to-be-processed object 15 to a predetermined value or within a permissible range.

The controlling device 110 respectively controls the operations of the first gas supplying device 16*a*, the second gas supplying device 16*b*, the high-frequency power supply 17, the constant-temperature water circulating device 18, and the inter-electrode gap adjusting mechanism 120, in order to perform plasma processing with the plasma source 100.

The inter-electrode gap adjusting mechanism 120 constitutes an inter-electrode gap adjusting device 20 in cooperation with the controlling device 110, and a concrete example of the inter-electrode gap adjusting device 20 is an inter-electrode gap adjusting device 20A having the following structure.

Figure 7C:
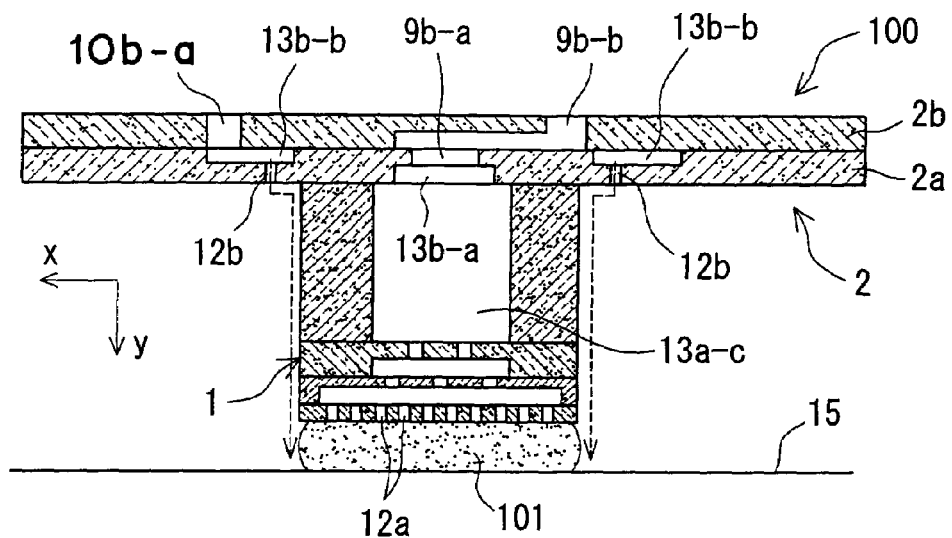
FIG. 7C is a cross-sectional view of a state where plasma is generated between the plasma source and the to-be-processed portion of the to-be-processed object, in the plasma processing apparatus employed in the first embodiment, the third embodiment, the fourth embodiment, the fifth embodiment, and the seventh embodiment of the present invention.
Figure 7D:
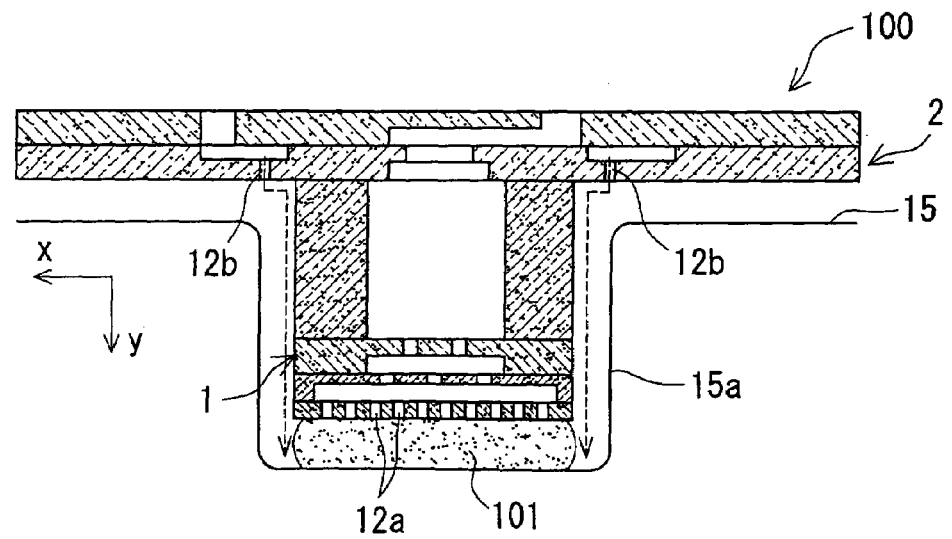
FIG. 7D is a cross-sectional view of a state where plasma is generated between the plasma source and the to-be-processed portion of the to-be-processed object for performing etching, in the plasma processing apparatus employed in the first embodiment, the third embodiment, the fourth embodiment, the fifth embodiment, and the seventh embodiment of the present invention.
Figure 7E:
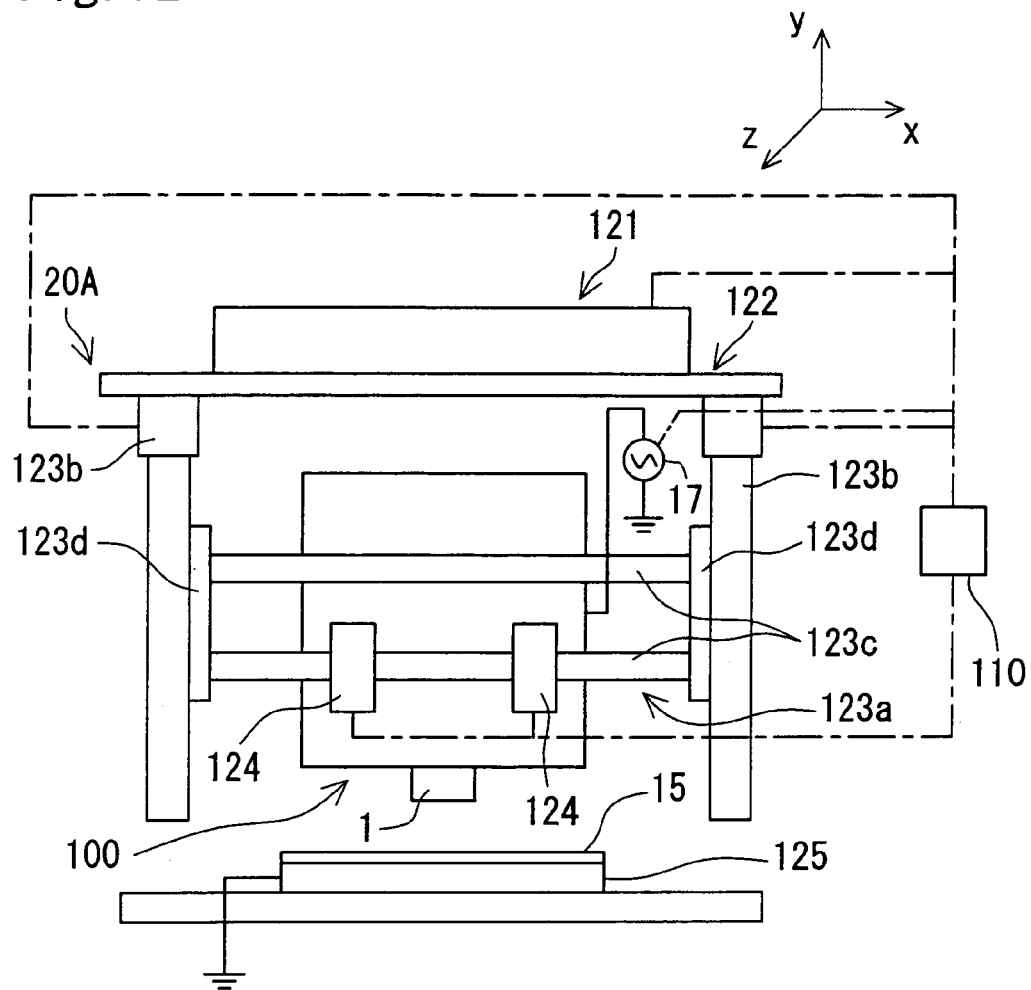
FIG. 7E is an explanation view illustrating an inter-electrode gap adjusting device, as a concrete example of the inter-electrode gap adjusting device in the plasma processing apparatus employed in the first embodiment etc. of the present invention.

As illustrated in FIG. 7E, the plasma source 100 is secured to a jig 123*a* that is constituted from a pair of bars 123*c* and stages 123*d* for securing the opposite ends of the pair of bars 123*c*. For example, the stages 123*d* of the jig 123*a* may be coupled to a pair of single-axis actuators 123*b* (a pair of motors, for example) which are operated under the control of the controlling device 110, and the pair of single-axis actuators 123*b* may be driven in synchronization with each other through the controlling device 110 to move the plasma source 100 in the direction of the y-axis. Further, the pair of single-axis actuators 123*b* are secured at their upper ends to a base plate 122, and the plasma source 100 can be moved in the x-z plain together with the pair of single-axis actuators 123*b* through an x-z stage 121 which is coupled to the base plate 122 and is operated under the control of the controlling device 110.

For example, two or more length-measurement lasers 124 are secured to the lower bar 123*c* of the jig 123*a* so that the distance R between the plasma source 100 and the to-be-processed object 15 placed on a counter electrode 125 can be measured at proper timing and the result of measurement can be input to the controlling device 110, under the operation control of the controlling device 110.

The gap (the distance R between the tip-end surface of the plasma source 100 (the surface closest to the to-be-processed portion of the to-be-processed object 15) and the to-be-processed portion of the to-be-processed object 15) is measured through the length-measurement lasers 124 and the measured value as the measurement result is fed back to the controlling device 110. Then, the distance of movement of the pair of single-axis actuators 123b is calculated and the pair of single-axis actuators 123b are driven and controlled with the controlling device 110 to maintain an optimal gap therebetween.

As described above, the pair of single-axis actuators 123b, the jig 123a (the pair of bars 123c and the stages 123d), the base plate 122, the x-z stage 121, and the length-measurement lasers 124 constitute the inter-electrode gap adjusting mechanism 120 and, on the basis of working-process information which has been input in advance to the controlling device 110 and inputs from the length-measurement lasers 124, the controlling device 110 controls the pair of single-axis actuators 123b and the x-z stage 121, thus realizing the aforementioned inter-electrode gap adjusting device 20A.

Figure 7F:
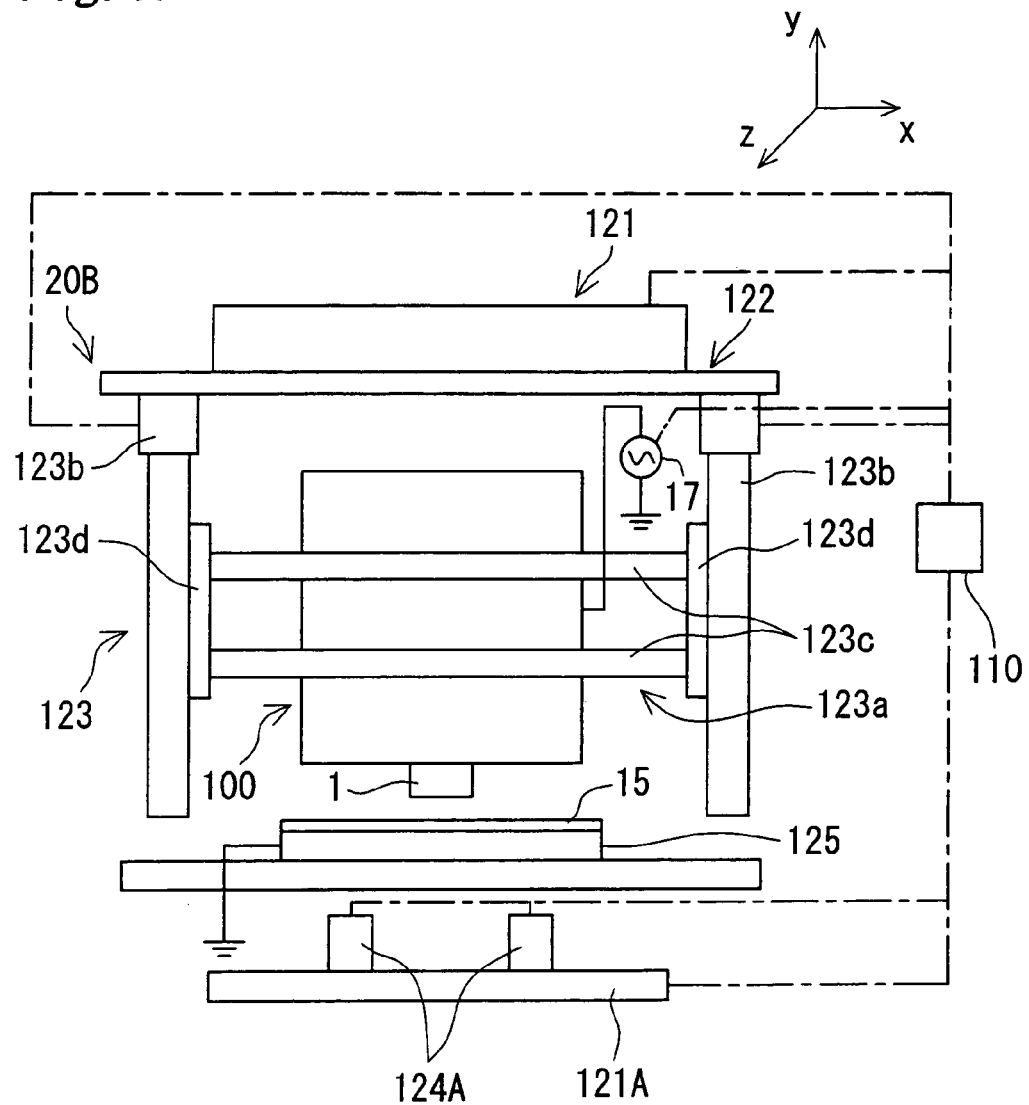
FIG. 7F is an explanation view illustrating an inter-electrode gap adjusting device, as another concrete example of the inter-electrode gap adjusting device in the plasma processing apparatus employed in the first embodiment etc. of the present invention.

The present invention is not limited to the structure of the aforementioned inter-electrode gap adjusting device 20A and may employ an inter-electrode gap adjusting device 20B as illustrated in FIG. 7F.

The inter-electrode gap adjusting device 20B illustrated in FIG. 7F is effective in cases where the to-be-processed object 15 is a transparent substrate (a substrate which mainly transmits the infrared-radiation wavelength region).

The counter electrode 125 is made of a transparent material such as quartz and is put into any of the following states; (i) The counter electrode 125 is maintained at a floating electric potential, not at a ground electric potential, or (ii) the counter electrode 125 is made of quartz having a transparent electrical conductive film made of, for example, ITO deposited on the surface thereof to maintain the counter electrode 125 at a ground electric potential.

Near the back surface of the opposing electrode 125, at least two length-measurement lasers 124A are secured to a lower x-z stage 121A which is operated under the control of the controlling device 110, and the lower x-z stage 121A can be moved in an x-z plain together with the two length-measurement lasers 124A in synchronization with an upper x-z stage 121 placed above the plasma source 100 or independently of the upper x-z stage 121, under the control of the controlling device 110. Further, the distance between the plasma source 100 and the length-measurement lasers 124A can be measured at proper timing and the result of measurement can be input to the controlling device 110, under the operational control of the controlling device 110. Also, the distance between the bottom portion of the to-be-processed portion of the to-be-processed object 15 and the length-measurement lasers 124A can be measured and the result of measurement can be input to the controlling device 110, and the processing depth can be measured and the distance between the bottom portion of the to-be-processed portion and the plasma source 100 can be measured and the result of measurement can be input to the controlling device 110.

Measured numerical values resulted from the measurement can be fed back to the controlling device 110 and the pair of single-axis actuators 123b can be driven and controlled by the controlling device 110 after each measurement. Consequently, during plasma processing, it is possible to maintain an optimal gap (a distance R between the tip end surface of the plasma source 100 (the surface of the plasma source 100 closest to the to-be-processed portion of the to-be-processed object 15) and the to-be-processed portion of the to-be-processed object 15), in taking account of the progress of the processing.

As described above, the length-measurement lasers 124A, the lower x-z stage 121A, the upper x-z stage 121, the jig 123a (the pair of bars 123c and the stages 123d), the pair of single-axis actuators 123b, and the base plate 122 constitute the inter-electrode gap adjusting mechanism 120 and, on the basis processing treatment information which has been input in advance to the controlling device 110 and inputs from the length-measurement lasers 124A, the controlling device 110 controls, the pair of single-axis actuators 123b, the upper x-z stage 121, and the lower x-z stage 121A, thereby realizing the aforementioned inter-electrode gap adjusting device 20B.

Figure 7G:
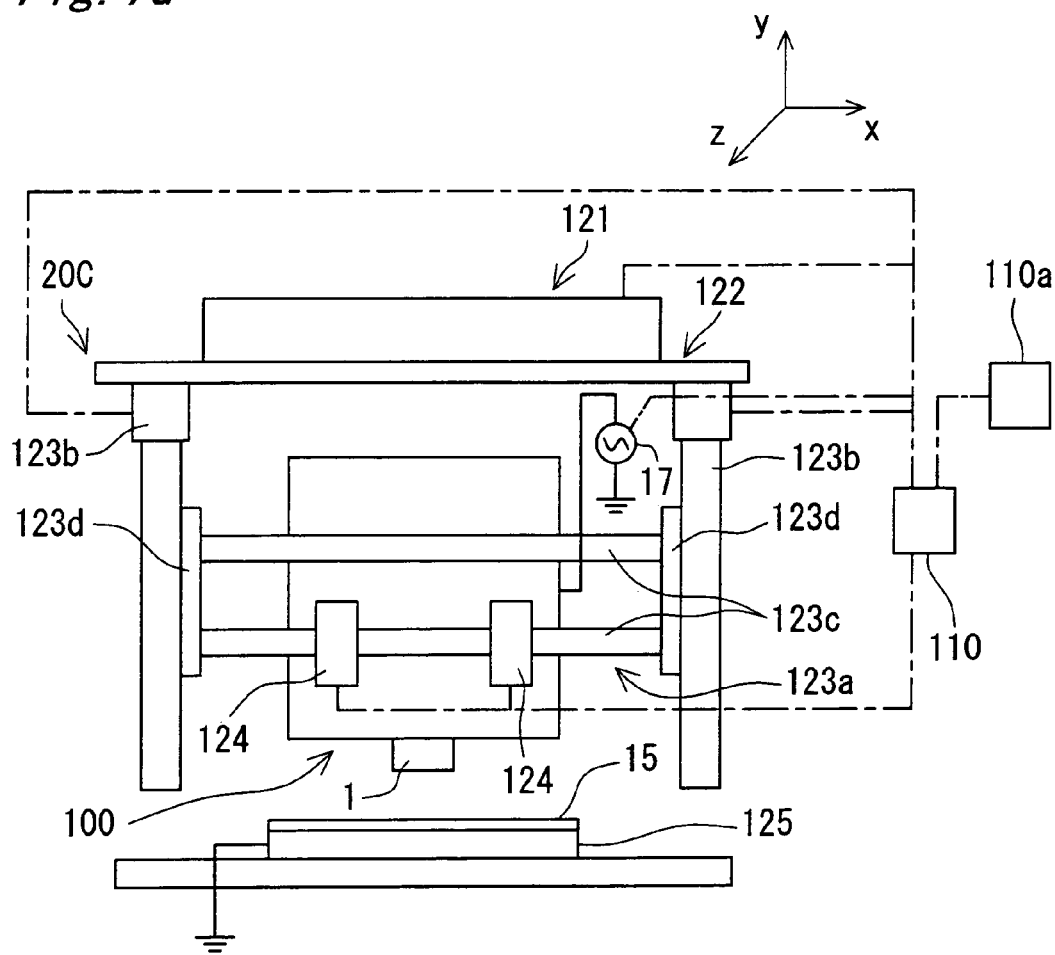
FIG. 7G is an explanation view illustrating an inter-electrode gap adjusting device, as a further other concrete example of the inter-electrode gap adjusting device in the plasma processing apparatus employed in the first embodiment etc. of the present invention.

The present invention is not limited to the structures of the aforementioned inter-electrode gap adjusting devices 20A and 20B and may employ an inter-electrode gap adjusting device 20C as illustrated in FIG. 7G.

As illustrated in FIG. 7G, when the electric discharge is off, the controlling device 110 operates a pair of single-axis actuators 123b to bring the tip end of the convex portion of the plasma source 100 into contact with the bottom portion of the to-be-processed portion of the to-be-processed object 15 and acquires information about the position, at the time the tip end of the convex portion of the plasma source 100 comes into contact with the bottom portion of the to-be-processed portion. The controlling device 110 repeats the aforementioned operation at proper time intervals to measure the processing depth resulted from plasma processing within a certain time range, from the position information acquired through contacting.

The determination as to whether the tip end of the convex portion of the plasma source 100 comes into contact with the bottom portion of the to-be-processed portion of the to-be-processed object 15 can be performed according to the following two methods. (i) The pair of single-axis actuators 123b are operated at a constant speed, while the distance between the tip end of the convex portion of the plasma source 100 and the to-be-processed object 15 is measured by the length-measurement laser 124. When the tip end of the convex portion of the plasma source 100 comes into contact with the to-be-processed object 15, the chance of the distance being measured by the length-measurement laser 124 becomes 0. (ii) The pair of single-axis actuators 123b are employed as one example of a driving device for moving the plasma source 100 and, in the case where a pair of motors are employed as a concrete example of the pair of single-axis actuators 123b, the plasma source 100 is operated while the load being applied to the pair of motors is measured and, when the tip end of the convex portion of the plasma source 100 comes into contact with the to-be-processed object 15, the load is suddenly increased.

The controlling device 110 controls the operations of the upper x-z stage 121, the pair of single-axis actuators 123b, the high-frequency power supply 17, the inter-electrode gap adjusting device 20C, and the like to repeatedly perform the following processes to adjust the gap to an optimal gap at constant time intervals; plasma processing; halt of the plasma processing; the measurement of the gap (the distance R between the first gas ejecting surface 1a-1 forming the tip end surface of the plasma source 100 and the to-be-processed portion of the to-be-processed object 15) using the contact therebetween; the adjustment of the gap to the optimal gap; and halt of the plasma processing.

When the inter-electrode gap adjusting device 20C of FIG. 7G is actually utilized, it is preferable that a calculation part 110a in the controlling device 110 predicts the total time required for processing through calculation (calculation from the etching rate), and the controlling device 110 halts plasma processing and measures the aforementioned distance through contacting, at time intervals corresponding to about 1/5 to 1/10 of the total time. Accordingly, when plasma processing is performed under the same condition as in the first embodiment, it is preferable that the distance measurement using contacting is conducted at time intervals of 70 s to 140 s. If the time interval of the distance measurement is greater than the time corresponding to 1/5 of the aforementioned total time required for processing, this will reduce the processing rate due to the increase of the gap along with the progress of the processing, thereby increasing the total time required for processing. If the time interval of the distance measurement is smaller than the time corresponding to 1/10 of the aforementioned total time required for processing, this will increase the down time during the plasma processing, thereby increasing the total time required for processing.

As described above, the pair of single-axis actuators 123b, the jig 123a (the pair of bars 123c and the stages 123d), the base plate 122, the x-z stage 121, and the length-measurement lasers 124 constitute the inter-electrode gap adjusting mechanism 120 and, on the basis of processing treatment information which has been input in advance to the controlling device 110 and inputs from the length-measurement lasers 124 and the like, the controlling device 110 controls the pair of single-axis actuators 123b and the x-z stage 121, thereby realizing the aforementioned inter-electrode gap adjusting device 20C.

FIG. 7C to FIG. 7D illustrate schematic views of the aforementioned plasma source 100 being used for processing a Si substrate as a to-be processed object 15, as one example. As in FIG. 7C to FIG. 7D, He as an example of the inert gas and $CF_4$ as an example of reactive gas, are supplied at 0.5 sccm, as an example of the first gas, from the aforementioned first gas supplying device 16a to the first gas flow channel 9 (see FIG. 3) through the first gas pipe 4a to eject the first gas from the first gas ejecting ports 12a in the first gas ejecting surface. Concurrently, $O_2$ as an example of electric-discharge suppressing gas is supplied, as an example of second gas, from the second gas supplying device 16b through the second gas pipe 4b to the eleventh gas flow channel 10 (see FIG. 3) to eject the second gas from the second gas ejecting ports 12a toward the periphery of the gap space between the first gas ejecting surface 1a-1 and the to-be-processed portion of the to-be-processed object 15 through the periphery of the convex portion. At this time, high-frequency electric power is supplied to the plasma source 100 from the high-frequency power supply 17 to generate plasma 101 between the first gas ejecting surface 1a-1 of the plasma source 100 of the plasma processing apparatus and the to-be-processed portion of the Si substrate as a to-be-processed object 15, as illustrated in FIG. 7C. Further, at this time, in order to cool the plasma source 100, cooling water can be supplied to or discharged from the plasma source 100, using the constant-temperature water circulating device 18, through the feed-water pipe 5a and the drain pipe 5b.

As illustrated in the enlarged view of FIG. 7B, an insulation layer 19 made of SiOx having a thickness of about 5 μm as one example is provided on the first gas ejecting surface 1a-1, which is the surface whose distance is the closest from the to-be-processed object 15, of the first laminated member 1 including the opening portions of the first gas ejecting ports 12a.

The reason for the provision of the insulation layer 19 is as follows. That is, it is characterized in that atmospheric-pressure plasma requires a higher discharge starting voltage and is prone to transition to arc electric discharge, in comparison with plasma generated at reduced pressures. In general, in order to suppress the transition to arc electric discharge, an insulation layer is provided on the electrode surface to be exposed to plasma in many cases and, in the present embodiment, a $SiO_2$ film as an example of the insulation layer 19 is provided on the first gas ejecting surface 1a-1 of the convex portion including the gas ejecting ports 12a. In addition, a metal layer may be provided on the electrode surface, in view of the resistance to gases used as reactive gases (etching resistance), the adhesion to the underlying layer, and the easiness of deposition.

Further, with the aforementioned inter-electrode gap adjusting device 20, the distance between the tip-end surface of the plasma source 100 of the plasma processing apparatus (the first gas ejecting surface 1a-1 including the opening portions of the first gas ejecting ports 12a) and the to-be-processed object 15 can be adjusted to a desired distance or within a permissible range.

By using the aforementioned plasma processing apparatus, at first, the gap distance R between the tip-end surface of the plasma source 100 of the plasma processing apparatus (the first gas ejecting surface 1a-1 including the opening portions of the first gas ejecting ports 12a) and the to-be-processed portion of a Si substrate as a to-be-processed object 15 is adjusted to 300 μm or an arbitrary value in the range of 100 μm to 1000 μm, as one example, through the inter-electrode gap adjusting device 20. Further, while 10 sccm of He and 0.5 sccm of CF4 are supplied as an example of the first gas, to the first gas flow channel 9 from the first gas supplying device 16a to eject the first gas from the first gas ejecting ports 12a in the first gas ejecting surface, 30 sccm of O2 is supplied as an example of the second gas from the second gas supplying device 16b to the eleventh gas flow channel 10 to eject the second gas from the second gas ejecting ports 12a towards the periphery of the gap space between the first gas ejecting surface 1a-1 and the to-be-processed portion of the to-be-processed object 15 through the periphery of the convex portion. At this time, a high-frequency electric power of 12 W is supplied to the plasma source 100 from the high-frequency power supply 17 to generate plasma 101 between the tip end surface of the plasma source 100 of the plasma processing apparatus (the first gas ejecting surface 1a-1 including the opening portions of the first gas ejecting ports 12a) and the to-be-processed portion of the Si substrate as a to-be-processed object 15. Thus, plasma processing is applied to the to-be-processed portion of the Si substrate for 700 s to form an etching groove 15a in the to-be-processed portion. At the same time, as one example, the plasma source 100 of the plasma processing apparatus is moved in the y direction in FIG. 7A (in the downward direction in FIG. 7C and FIG. 7D), at a speed of 60 μm/min, with the aforementioned inter-electrode gap adjusting device 20.

The lower limit of the gap distance R is set to 100 μm because the plasma density becomes significantly reduced if the gap distance is smaller than this value. The upper limit is set to 1000 μm is because generating plasma becomes difficult if the gap distance is greater than this value.

Figure 8:
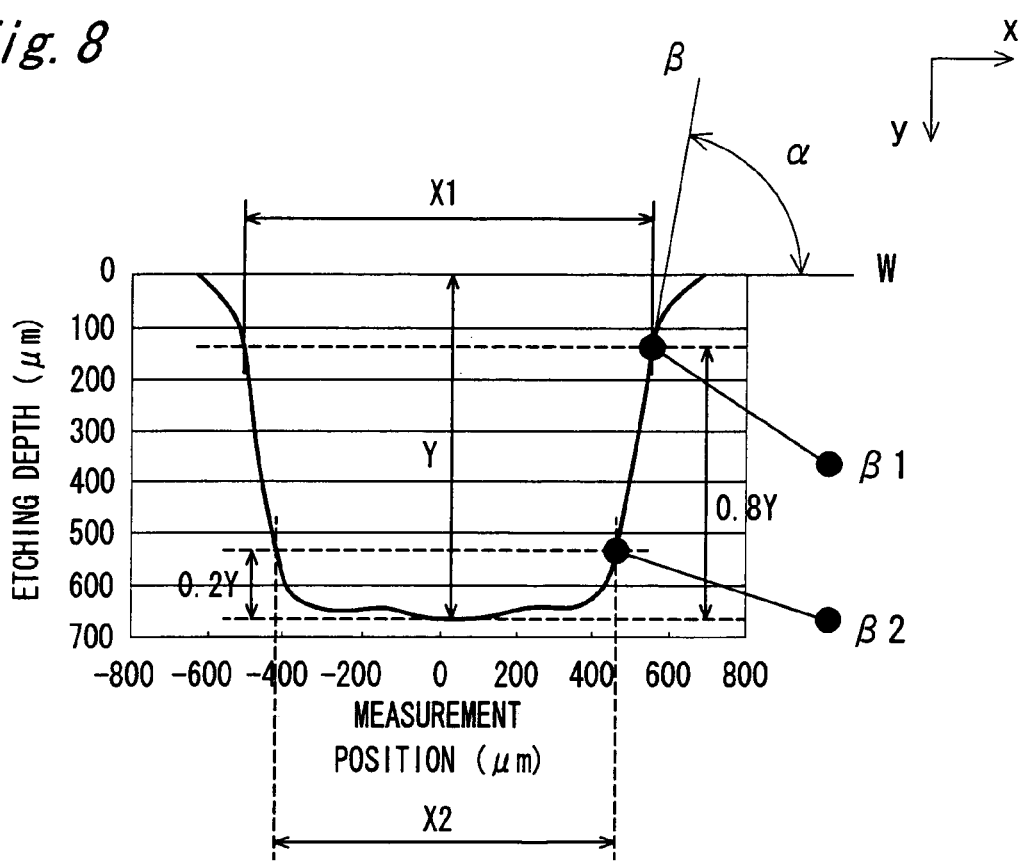
FIG. 8 is a schematic view of an etching shape resulted from processing by the plasma processing apparatus employed in the first embodiment of the present invention.

FIG. 8 illustrates an example of an etching shape in a Si substrate as a to-be-processed object 15, according to the first embodiment.

Referring to FIG. 10, as one example, the etching depth Y of the etching groove 15a, which is a to-be-processed-portion, was 663 μm, the line width X1 of the upper end portion of the etching groove 15a was 1075 μm and the line width X2 of the bottom portion of the etching groove 15a was 868 μm, and therefore, the angle α representing the verticality of the shape of the etching groove 15a was 75.4° (note that the horizontal axis and the vertical axis in FIG. 8 have different orders). Accordingly, in performing a fine process with a depth on the order of several hundreds micrometers, the verticality of the etching shape of the etching groove 15a was improved and also the plasma processing was completed without being interrupted halfway through the processing.

The aforementioned improvement of the verticality and the avoidance of etching interruption were realized for the following three reasons.

As the first reason, the plasma source 100 includes the convex portion (the first laminated member 1) at a portion of the surface thereof opposing to the aforementioned to-be-processed object 15, and also the aforementioned convex portion is provided with the first gas ejecting surface 1a-1 including the opening portions of the first gas ejecting ports 12a of the plasma source 100. Further, the aforementioned convex portion is formed to have a size very small enough to be inserted into the to-be-processed portion of the to-be-processed object 15, for example, a to-be-finely-processed portion thereof. Accordingly, even when the position of the bottom portion of the to-be-finely-processed portion of the to-be-processed object 15 is changed with the progress of the etching, the aforementioned convex portion can be inserted into the to-be-finely-processed portion, through the inter-electrode gap adjusting device 20, to maintain the distance R between the to-be-processed object 15 and the plasma source 100 of the plasma processing apparatus within a certain range (within a permissible range). If the distance R between the to-be-processed object 15 and the plasma source 100 of the plasma processing apparatus exceeds beyond the permissible range, the discharge starting voltage rises, and, as can be explained by Paschen's law, the generation and maintenance of plasma becomes difficult, causing the interruption of the etching rate.

The second reason is that the surface of the plasma source 100 of the plasma processing apparatus which is faced with the to-be-processed object 15 has a convex shape and thus forms a convex portion, and the first gas ejecting ports 12a are provided only in the first gas ejecting surface 1a-1, which is the surface of the convex portion facing to the to-be-processed object 15. This enables generating plasma only between the tip end portion of the convex portion of the plasma source 100 of the plasma processing apparatus and the to-be-processed portion of the to-be-processed object 15, which can prevent the side walls of the etching groove 15a in the to-be-processed object 15 from being etched more than necessary.

As the third reason, the second gas ejecting ports 12b are evenly arranged in a line in the second laminated member 2 in a rectangular frame shape around the first laminated member 1, which enables supplying the second gas substantially in a rectangular cylindrical shape along all the side surfaces of the convex portion of the plasma source 100 of the plasma processing apparatus. By this, it is possible to avoid the generation of plasma on the side walls of the etching groove 15a in the to-be-processed object 15, and, even in the event of the generation of plasma on the side walls of the etching groove 15a, the rate of oxidation of Si can be made greater than the rate of etching Si away from the aforementioned side walls, due to the presence of $O_2$ gas.

As described above, according to the aforementioned first embodiment, the plasma source 100 includes the convex portion having a size small enough to be inserted into a to-be-finely-processed portion. Accordingly, even when the position of the bottom portion of the to-be-finely-processed portion of the to-be-processed object 15 is changed with the progress of etching, the aforementioned convex portion can be inserted into the to-be-finely-processed portion with the inter-electrode gap adjusting device 20, which enables maintaining the distance between the plasma source 100 and the bottom portion of the to-be-processed object 15 at a substantially constant value, thereby realizing a plasma processing apparatus and a plasma processing method less prone to interruption of etching in the depthwise direction in desired to-be-finely processed portions. As a result, it is possible to apply plasma processing to desired to-be-finely-processed portions having depths on the order of several hundreds nanometers to several hundreds micrometers to provide etching shapes with excellent verticality, without interrupting etching in the depthwise direction.

Further, the respective openings of the first gas ejecting ports 12a have a cross sectional area smaller than the cross-sectional area of the space of the first buffer layer 13a-a parallel to the aforementioned cross-sectional area, which can further improve the uniformity of gas ejection over the first gas ejecting surface 1a-1 including the first gas ejecting ports 12a, thereby enabling generating plasma uniformly over the first gas ejecting surface 1a-1. As a result, it is possible to perform plasma processing without forming unrequired taper portions at the bottom portion the to-be-processed object 15, and accordingly, the plasma processing may be performed to desired to-be-finely-processed portions with depths on the order of several hundreds nanometers to several hundreds micrometers to provide etching shapes with excellent verticality, without interrupting the etching in the depthwise direction.

Second Embodiment

Hereinafter, with reference to FIG. 9A to FIG. 10, a second embodiment of the present invention will be described. Further, a plasma processing apparatus according to the present embodiment basically has the same structure as that in FIG. 1 to FIG. 6 and, hereinafter, there will be described only the differences from the plasma processing apparatus described in the first embodiment.

The second embodiment is different from the first embodiment in that a conductor layer 21 is provided on the first gas ejecting surface 1a-1 of the first laminated member 1 including the opening portions of the first gas ejecting ports 12a, instead of the insulation layer 19.

Figure 9A:
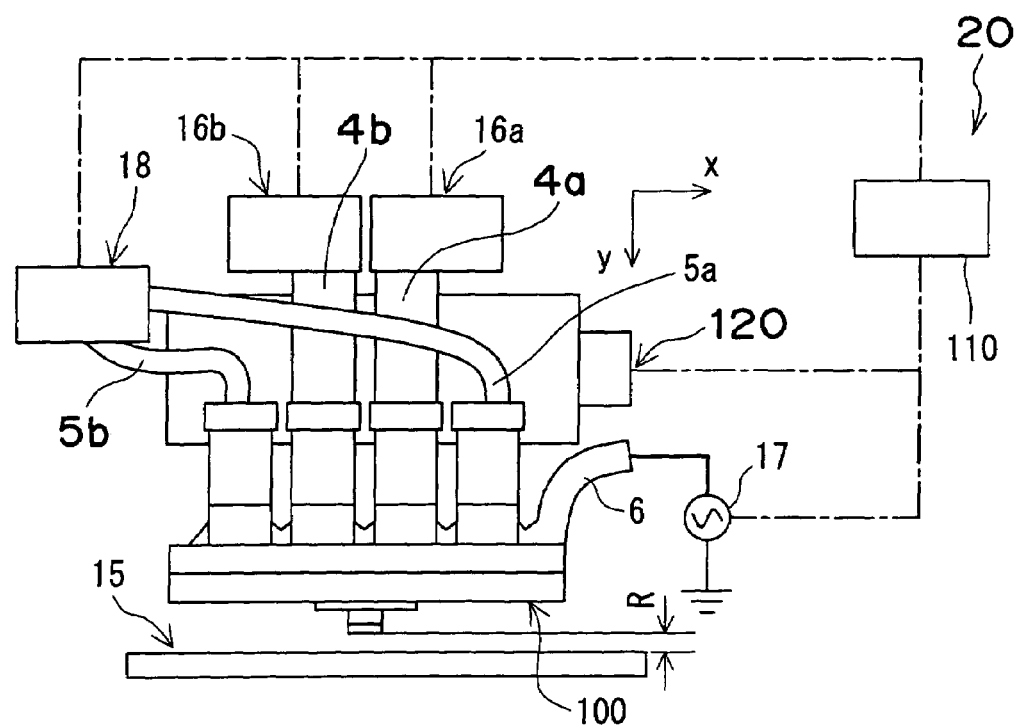
FIG. 9A is an external view of a plasma processing apparatus employed in a second embodiment of the present invention.

FIG. 9A illustrates a schematic view processing of a Si substrate as a to-be processed object 15 using the plasma processing apparatus. As shown in FIG. 9A, for example, He as an example of inert gas and $CF_4$ as an example of reactive gas, are supplied at 0.5 sccm, as an example of an electrically-discharging gas or the first gas, from the first gas supplying device 16a to the first gas flow channel 9 (see FIG. 3) through the first gas pipe 4a to eject the first gas from the first gas ejecting ports 12a in the first gas ejecting surface. Concurrently, $O_2$ as an example of an electric-discharge suppressing gas or the second gas is supplied from the second gas supplying device 16b through the second gas pipe 4b to the eleventh gas flow channel 10 (see FIG. 3) to eject the second gas from the second gas ejecting ports 12a toward the periphery of the gap space between the first gas ejecting surface 1a-1 and the to-be-processed portion of the to-be-processed object 15 through the periphery of the convex portion. At this time, high-frequency electric power is supplied to the plasma source 100 from the high-frequency power supply 17 so that plasma (see 101 in FIGS. 7C to 7D) can be generated between the plasma source 100 of the plasma processing apparatus and the to-be-processed portion of the Si substrate as a to-be-processed object 15.

Further, at this time, in order to cool the plasma source 100, cooling water can be supplied to or discharged from the plasma source 100, using the constant-temperature water circulating device 18, through the feed-water pipe 5a and the drain pipe 5b.

Figure 9B:
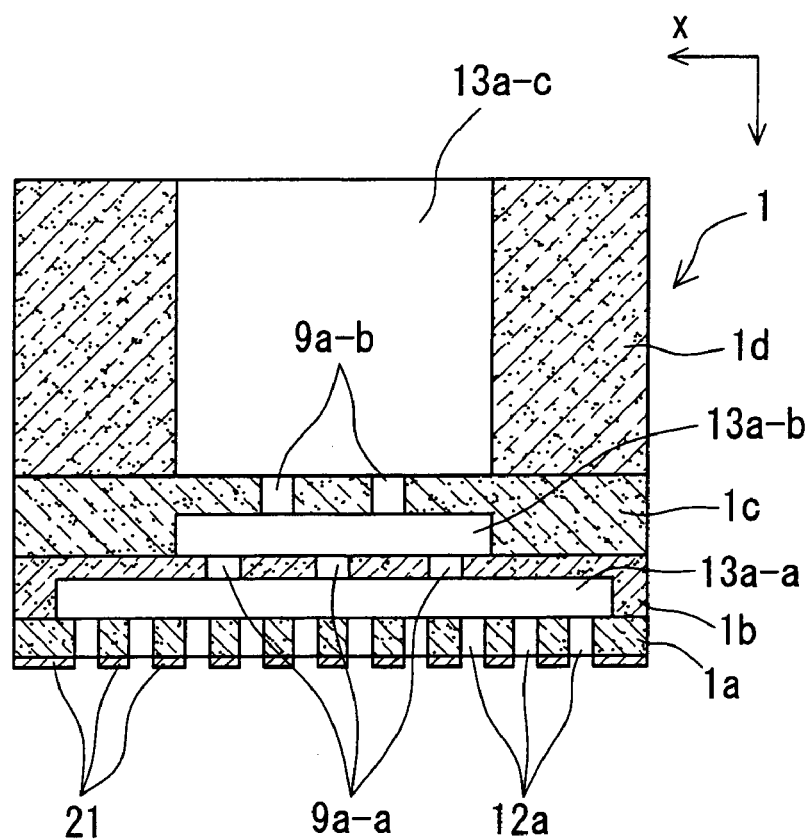
FIG. 9B is a partial enlarged cross-sectional view of a plasma source in the plasma processing apparatus employed in the second embodiment of the present invention.

As illustrated in the enlarged view of FIG. 9B, as one example, a conductor layer 21 made of Ni having a thickness of about 1 μm is provided on the first gas ejecting surface 1a-1, whose distance is the smallest from the to-be-processed object 15, of the first laminated member 1 including the opening portions of the first gas ejecting ports 12a. The conductor layer 21 in the plasma source 100 according to the second embodiment is provided due to the following reason, instead of the insulation layer in the plasma source 100 according to the first embodiment. The conductor layer 21 is provided on the electrode surface as an example of the metal layer, in consideration of the resistance to gases used as reactive gases (etching resistance) and the adhesion to the underlying layer and easiness of film formation.

By using the aforementioned plasma processing apparatus, at first, the gap distance R between the tip-end surface of the plasma source 100 of the plasma processing apparatus (the first gas ejecting surface 1a-1 including the opening portions of the first gas ejecting ports 12a) and the to-be-processed portion of a Si substrate as a to-be-processed object 15 was adjusted to 300 μm, as one example, through the inter-electrode gap adjusting device 20. Further, 10 sccm of He and 0.5 sccm of CF4 were supplied as an example of the first gas (electrically-discharging gas), to the first gas flow channel 9 from the first gas supplying device 16a to eject the first gas from the first gas ejecting ports 12a in the first gas ejecting surface. Concurrently, 30 sccm of O2 was supplied as an example of the second gas (electrical-discharge suppressing gas), from the second gas supplying device 16b to the eleventh gas flow channel 10 to eject the second gas from the second gas ejecting ports 12a towards the periphery of the gap space between the first gas ejecting surface 1a-1 and the to-be-processed portion of the to-be-processed object 15 through the periphery of the convex portion. At this time, a high-frequency electric power of 12 W was supplied to the plasma source 100 from the high-frequency power supply 17 to generate plasma at the gap between the tip end surface of the plasma source 100 of the plasma processing apparatus (the first gas ejecting surface 1a-1 including the opening portions of the first gas ejecting ports 12a) and the to-be-processed portion of the Si substrate as a to-be-processed object 15. Thus, plasma processing was applied to the to-be-processed portion of the Si substrate employed as a to-be-processed object 15 for 700 s to form an etching groove 15a in the to-be-processed portion. At the same time, as one example, the plasma source 100 of the plasma processing apparatus was moved in the y direction in FIG. 9A, at a speed of 60 μm/min, with the aforementioned inter-electrode gap adjusting device 20. FIG. 10 comprehensively illustrates an example of the etching shape in the Si substrate as a to-be-processed object 15, according to the second embodiment.

Referring to FIG. 10, as one example, the etching depth Y of the etching groove 15a, which was a to-be-processed-portion, was 688 μm, the line width X1 of the upper end portion of the etching groove 15a was 1120 μm and the line width X2 of the bottom portion of the etching groove 15a was 890 μm. Accordingly, the angle α indicating the verticality of the shape of the etching groove 15a was 74.4°. Accordingly, in performing a fine processing with a depth on the order of several hundreds micrometers, the verticality of the shape of the etching groove 15a was improved and also the plasma processing was completed without being interrupted halfway through the processing.

The improvement of the verticality and the avoidance of the etching interruption were realized for the three reasons described in the first embodiment.

As described above, according to the second embodiment, it is possible to provide the same effects and advantages as those of the first embodiment.

Third Embodiment

Hereinafter, with reference to FIG. 7A to FIG. 10, a third embodiment of the present invention will be described. Further, the plasma processing apparatus according to the present embodiment basically has the same structure as that in FIG. 1 to FIG. 6 and, hereinafter, there will be described only the differences from the plasma processing apparatus according to the first embodiment.

The present embodiment is different from the first embodiment in that the second gas is not used.

Regarding the plasma processing, by using the plasma processing apparatus in FIG. 7A, at first, as one example, the gap distance R between the tip-end surface of the plasma source 100 of the plasma processing apparatus (the first gas ejecting surface 1a-1 including the opening portions of the first gas ejecting ports 12a) and the to-be-processed portion of a Si substrate as a to-be-processed object 15 was adjusted to 300 μm. Further, 9 sccm of He and 0.4 sccm of CF4 were supplied as an example of the first gas, to the first gas flow channel 9 from the first gas supplying device 16a to eject the first gas from the first gas ejecting ports 12a in the first gas ejecting surface. At this time, a high-frequency electric power of 12 W was supplied to the plasma source 100 from the high-frequency power supply 17 to generate plasma between the tip end surface of the plasma source 100 of the plasma processing apparatus (the first gas ejecting surface 1a-1 including the opening portions of the first gas ejecting ports 12a) and the to-be-processed portion of the Si substrate as a to-be-processed object 15. Thus, plasma processing was applied to the to-be-processed portion of the Si substrate employed as a to-be-processed object 15 for 700 s to form an etching groove 15a in the to-be-processed portion. At the same time, as one example, the plasma source 100 of the plasma processing apparatus was moved in the y direction in FIG. 7A, at a speed of 60 μm/min, with the aforementioned inter-electrode gap adjusting device 20. FIG. 10 comprehensively illustrates an example of the etching shape in the Si substrate as the to-be-processed object 15, according to the third embodiment.

Referring to FIG. 10, as one example, the etching depth Y of the etching groove 15a, which was a to-be-processed-portion, was 653 μm, the line width X1 of the upper end portion of the etching groove 15a was 1370 μm and the line width X2 of the bottom portion of the etching groove 15a was 870 μm. Accordingly, the angle α indicating the verticality of the shape of the etching groove 15a was 57.5° Accordingly, in performing a fine processing with a depth on the order of several hundreds micrometers, the verticality of the shape of the etching groove 15a was improved and also the plasma processing was completed without being interrupted halfway through the processing.

The improvement of the verticality and the avoidance of the etching interruption could be realized for the first and second reasons described in the first embodiment.

As described above, according to the aforementioned third embodiment, similarly to in the aforementioned first embodiment, the plasma source 100 includes the convex portion having a size very small enough to be inserted into a to-be-finely-processed portion. Accordingly, even when the position of the bottom portion of the to-be-finely-processed portion of the to-be-processed object 15 is changed with the progress of the etching, the aforementioned convex portion can be inserted into the to-be-finely-processed portion through the inter-electrode gap adjusting device 20, which enables maintaining the distance between the plasma source 100 and the bottom portion of the to-be-processed object 15 at a substantially constant value, thereby realizing a plasma processing apparatus and a plasma processing method less prone to interruption of etching in the depthwise direction in desired to-be-finely processed portions. This enables applying plasma processing to desired to-be-finely-processed portions having depths on the order of several hundreds nanometers to several hundreds micrometers to provide etching shapes with excellent verticality, without interrupting etching in the depthwise direction.

Further, the respective openings of the first gas ejecting ports 12a have a cross sectional area smaller than the cross-sectional area of the space of the first buffer layer 13a-a parallel to the aforementioned cross-sectional area, which can further improve the uniformity of gas ejection over the first gas ejecting surface 1a-1 including the first gas ejecting ports 12a, thereby enabling generating plasma uniformly over the first gas ejecting surface 1a-1. As a result, it is possible to perform plasma processing without forming unrequired taper portions at the bottom portion the to-be-processed object 15, and accordingly, the plasma processing may be performed to desired to-be-finely-processed portions with depths on the order of several hundreds nanometers to several hundreds micrometers to provide etching shapes with excellent verticality, without interrupting the etching in the depthwise direction. Furthermore, since no second gas is used, it is possible to reduce the number of processes required for fabricating the plasma source (the number of processes required for fabricating the second gas paths and the like), thereby reducing the cost and time required for fabrication.

Fourth Embodiment

Hereinafter, with reference to FIG. 7A, FIG. 10, and FIG. 11, a fourth embodiment of the present invention will be described. Further, a plasma processing apparatus according to the fourth embodiment basically has the same structure as that in FIG. 1 to FIG. 6 and, hereinafter, there will be described only the differences from the plasma processing apparatus according to the first embodiment.

The fourth embodiment is different from the first embodiment in that the shape of the first laminated member 1 is changed. Namely, the plain shape of the first laminated member 1 is changed from a square shape to a rectangular shape.

Figure 11:
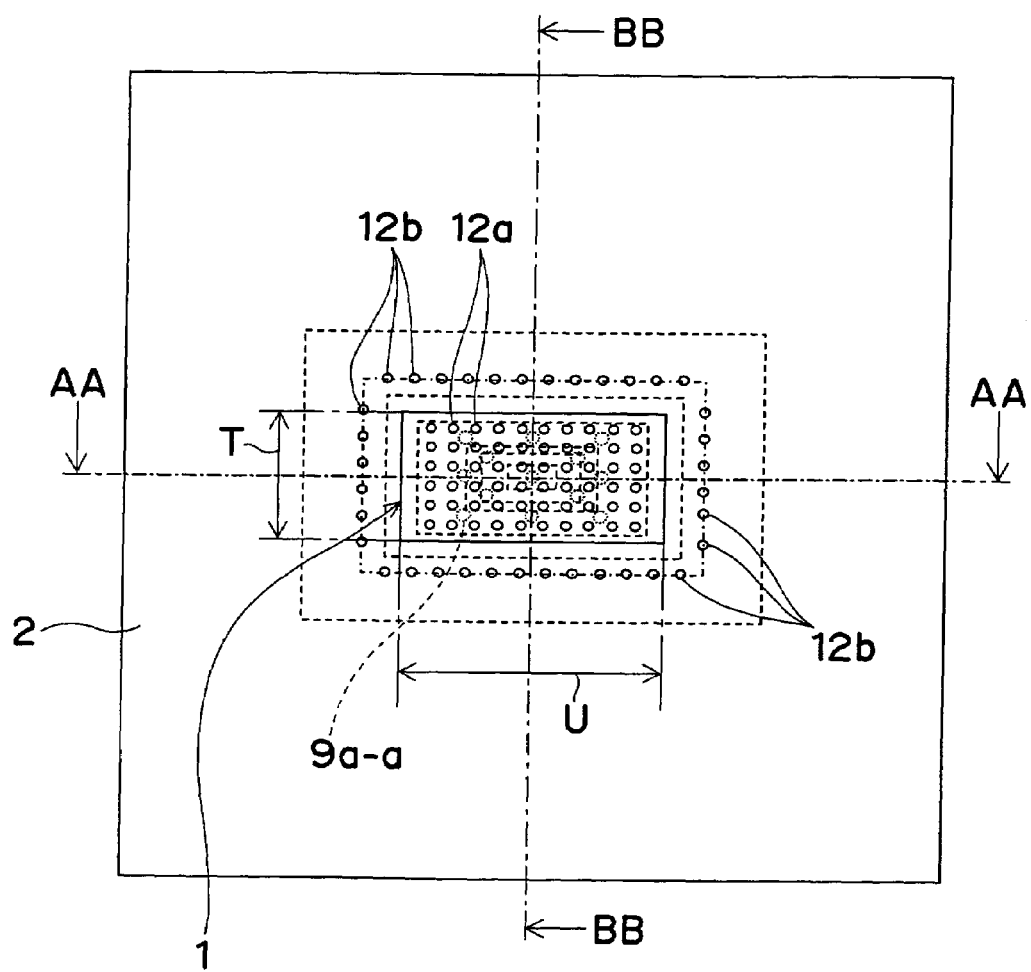
FIG. 11 is an enlarged plan view of a plasma processing apparatus employed in the fourth embodiment of the present invention.

FIG. 11 illustrates a view corresponding to the enlarged plan view of the plasma source 100 in FIG. 1 according to the first embodiment, and the cross-sectional view taken along the plain AA-AA in FIG. 11 is substantially the same as that illustrated in FIG. 3. As one example, the first laminated member 1 has a rectangular plain with a width T of 400 μm and a width U of 800 μm.

Regarding the plasma processing, by using the aforementioned plasma processing apparatus of FIG. 7A, at first, as one example, the gap distance R between the tip-end surface of the plasma source 100 of the plasma processing apparatus (the first gas ejecting surface 1a-1 including the opening portions of the first gas ejecting ports 12a) and the to-be-processed portion of a Si substrate used as a to-be-processed object 15 was adjusted to 300 μm through the inter-electrode gap adjusting device 20. Further, 10 sccm of He and 0.5 sccm of CF4 were supplied as an example of the first gas, to the first gas flow channel 9 from the first gas supplying device 16a to eject the first gas from the first gas ejecting ports 12a in the first gas ejecting surface. Concurrently, 30 sccm of O2 was supplied as an example of the second gas, from the second gas supplying device 16b to the eleventh gas flow channel 10 to eject the second gas from the second gas ejecting ports 12a towards the periphery of the gap space between the first gas ejecting surface and the to-be-processed portion of the to-be-processed object 15 through the periphery of the convex portion. At this time, a high-frequency electric power of 12 W was supplied to the plasma source 100 from the high-frequency power supply 17 to generate plasma between the tip end surface of the plasma source 100 of the plasma processing apparatus (the first gas ejecting surface 1a-1 including the opening portions of the first gas ejecting ports 12a) and the to-be-processed portion of the Si substrate used as a to-be-processed object 15. Thus, plasma processing was applied to the to-be-processed portion of the Si substrate employed as a to-be-processed object 15 for 700 s to form an etching groove 15a in the to-be-processed portion.

At the same time, as one example, the plasma source 100 of the plasma processing apparatus was moved in the y direction in FIG. 7A, at a speed of 60 μm/min, with the aforementioned inter-electrode gap adjusting device 20. FIG. 10 comprehensively illustrates an example of the etching shape in a Si substrate according to the fourth embodiment. Here, the etching shape was calculated from the cross-sectional view along the surface parallel to the plain BB-BB in FIG. 11.

Referring to FIG. 10, as one example, the etching depth Y of the etching groove 15a, which was the to-be-processed-portion, was 655 μm, the line width X1 of the upper end portion of the etching groove 15a was 652 μm, and the line width X2 of the bottom portion of the etching groove 15a was 502 μm. Accordingly, the angle α indicating the verticality of the shape of the etching groove 15a was 79.2°. Accordingly, in performing a fine processing with a depth on the order of several hundreds micrometers, the verticality of the shape of the etching groove 15a was improved and also the plasma processing was completed without being interrupted halfway through the processing.

The improvement of the verticality and the avoidance of the etching interruption could be realized for the three reasons described in the first embodiment.

As described above, according to the fourth embodiment, since the plain shape of the first laminated member 1 is changed from a squire shape to a rectangular shape, the time required for forming line-shaped etching grooves, for example, can be reduced, thereby improving the productivity. This is because the increase of the size from the square shape to the rectangular shape can widen the etching range and also the increased size can increase the scanning speed, since the etching rate is decreased with increasing the scanning speed and thus the etching rate becomes largest at a static state.

Fifth Embodiment

Hereinafter, with reference to FIG. 7A, FIG. 10, and FIG. 12, a fifth embodiment of the present invention will be described. Further, a plasma processing apparatus according to the fifth embodiment basically has the same structure as that in FIG. 1 to FIG. 6 and, hereinafter, there will be described only the differences from the plasma processing apparatus according to the first embodiment.

The fifth embodiment is different from the first embodiment in that the shape of the first laminated member 1, namely the shape of the convex portion, is changed from the rectangular column shape to a circular column shape. By changing the shape of the convex portion to the circular column shape, as compared with the rectangular column, it is possible to alleviate the local concentration of electric fields due to the less number of corner portions, which can offer the advantage of suppression of the transition to arc electric discharge.

Figure 12:
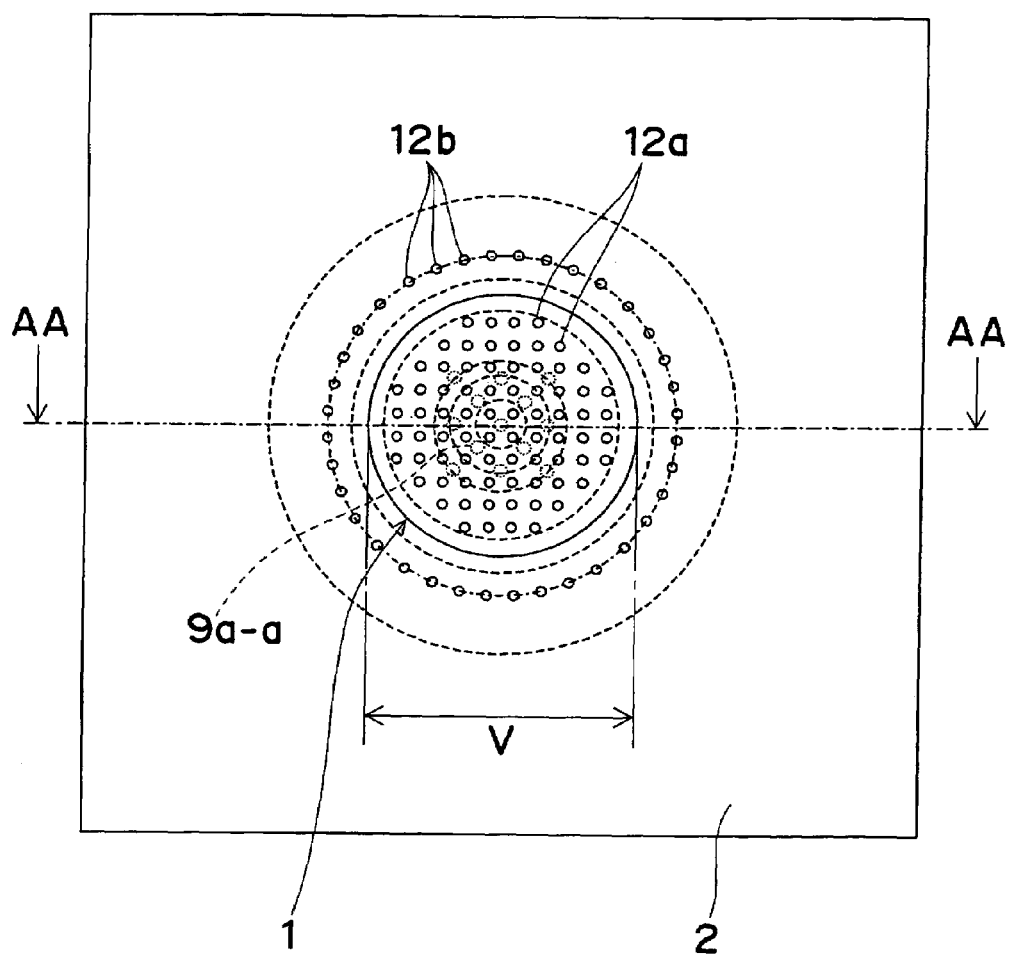
FIG. 12 is an enlarged plan view of the plasma source of the plasma processing apparatus employed in the fifth embodiment of the present invention.

FIG. 12 illustrates a plan view of the plasma source according to the third embodiment, corresponding to the plan view of the plasma source of the plasma processing apparatus in FIG. 1 according to the first embodiment, and the cross-sectional view taken along the plain AA-AA in FIG. 12 is the same as that illustrated in FIG. 3. As one example, the convex portion has a circular shape with a diameter V of 800 μm.

Regarding plasma processing, by using the plasma processing apparatus in FIG. 7A, at first, as one example, the gap distance R between the tip-end surface of the plasma source 100 of the plasma processing apparatus (the first gas ejecting surface 1a-1 including the opening portions of the first gas ejecting ports 12a) and the to-be-processed portion of a Si substrate used as a to-be-processed object 15 was adjusted to 300 μm through the inter-electrode gap adjusting device 20. Further, 10 sccm of He and 0.5 sccm of CF4 were supplied as an example of the first gas, to the first gas flow channel 9 from the first gas supplying device 16a to eject the first gas from the first gas ejecting ports 12a in the first gas ejecting surface. Concurrently, 30 sccm of O2 was supplied as an example of the second gas, from the second gas supplying device 16b to the eleventh gas flow channel 10 to eject the second gas from the second gas ejecting ports 12a towards the periphery of the gap space between the first gas ejecting surface and the to-be-processed portion of the to-be-processed object 15 through the periphery of the convex portion. At this time, a high-frequency electric power of 12 W was supplied to the plasma source 100 from the high-frequency power supply 17 to generate plasma 101 in the gap between the tip end surface of the plasma source 100 of the plasma processing apparatus (the first gas ejecting surface 1a-1 including the opening portions of the first gas ejecting ports 12a) and the to-be-processed portion of the Si substrate used as the to-be-processed object 15. Thus, plasma processing was applied to the to-be-processed portion of the Si substrate employed as the to-be-processed object 15 for 700 s to form an etching groove 15a in the to-be-processed portion. At the same time, as one example, the plasma source 100 of the plasma processing apparatus was moved in the y direction in FIG. 7A, at a speed of 60 μm/min, with the aforementioned inter-electrode gap adjusting device 20. FIG. 10 comprehensively illustrates an example of the etching shape in the Si substrate as the to-be-processed object 15, according to the fifth embodiment.

Referring to FIG. 10, as one example, the etching depth Y of the etching groove 15a, which was a to-be-processed-portion, was 662 μm, the line width X1 of the upper end portion of the etching groove 15a was 999 μm, and the line width X2 of the bottom portion of the etching groove 15a was 859 μm. Accordingly, the angle α indicating the verticality of the shape of the etching groove 15a was 80.0°. Accordingly, in performing a fine processing with a depth on the order of several hundreds micrometers, the verticality of the shape of the etching groove 15a was improved and also the plasma processing was completed without being interrupted halfway through the processing.

The improvement of the verticality and the avoidance of the etching interruption could be realized for the three reasons described in the first embodiment.

As described above, according to the fifth embodiment, since the first laminated member 1, namely the convex portion, is formed to have a circular column shape, it is possible to alleviate the local concentration of electric fields due to the less number of corner portions in comparison with the convex portion of the rectangular column shape, thereby suppressing the transition to arc electric discharge, in addition to the effects and advantages of the first embodiment. Further, it is possible to easily improve the uniformity of the etching grooves within the surface.

Sixth Embodiment

Hereinafter, with reference to FIG. 10 and FIG. 13A, a sixth embodiment of the present invention will be described. Further, the plasma processing apparatus according to the sixth embodiment basically has the same structure as that in FIG. 1 to FIG. 6 and, hereinafter, there will be described only the differences from the plasma processing apparatus according to the first embodiment.

The sixth embodiment is different from the first embodiment in that a counter electrode 22 is placed on the back surface of a to-be-processed object 15 and the conductive wire 6 of the plasma source 100 of the plasma processing apparatus is maintained at a ground electric potential while the high-frequency power supply 17 is connected to the counter electrode 22. By applying a high frequency to the counter electrode 22 as described above, it is possible to offer the advantage of easiness of the connection between the high-frequency power supply 17 and the counter electrode 22. Further, in the case of moving the plasma source 100 while applying high-frequency electric power, if the high-frequency power supply 17 is connected to the plasma source 100, this may cause disengagement or bending of the power-supply cable or entanglement of the power-supply cable with other cables, thus resulting in risks such as short circuits of cables or heat generation therefrom. However, when the high-frequency power supply 17 is connected to the counter electrode 22, the counter electrode can be kept secured by, for example, increasing the area of the substrate electrode, thereby offering the advantage of avoidance of the aforementioned risks.

Figure 13A:
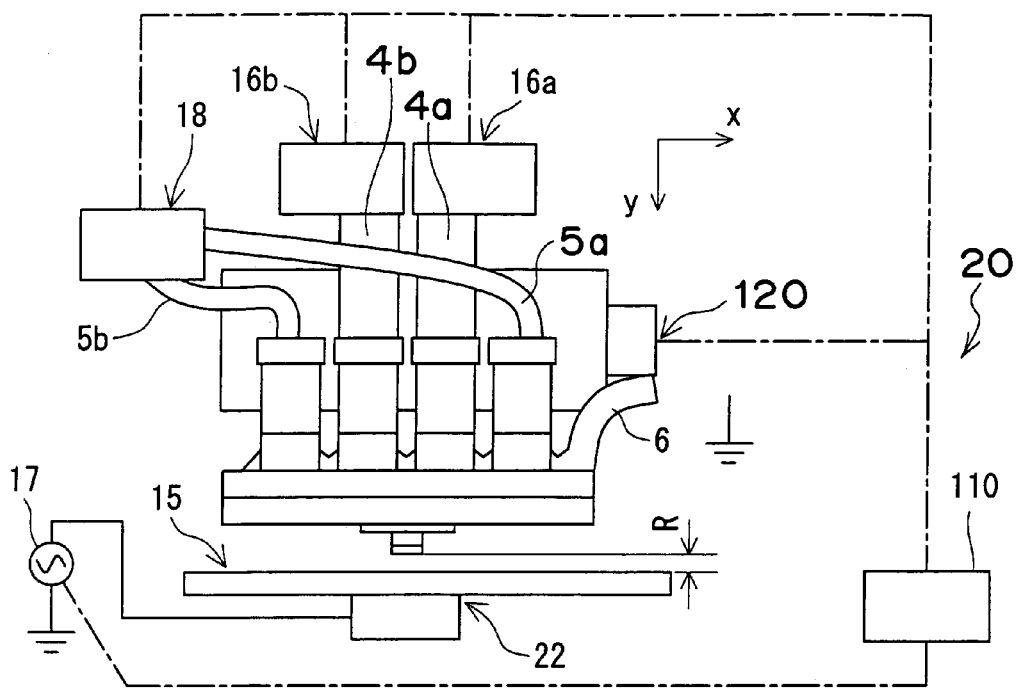
FIG. 13A is an external view of the plasma processing apparatus employed in the sixth embodiment of the present invention.
Figure 13B:
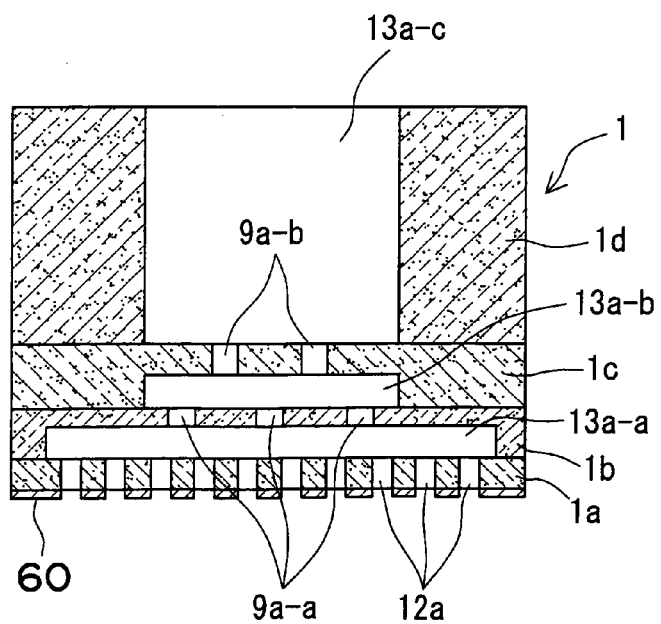
FIG. 13B is a partial enlarged cross-sectional view of the plasma source in the plasma processing apparatus employed in the sixth embodiment of the present invention.

FIG. 13A illustrates a schematic view in processing of a Si substrate used as a to-be processed object 15 using the plasma processing apparatus. As in FIG. 13A, He as an inert gas and $CF_4$ as a reactive gas are supplied at 0.5 sccm from the first gas supplying device 16a through the first gas pipe 4a to eject the first gas from the first gas ejecting ports 12a in the first gas ejecting surface. Concurrently, $O_2$ as an electric-discharge suppressing gas is supplied from the second gas supplying device 16b through the second gas pipe 4b to eject the second gas from the second gas ejecting ports 12a toward the periphery of the gap space between the first gas ejecting surface 1a-1 and the to-be-processed portion of the to-be-processed object 15 through the periphery of the convex portion. At this time, high-frequency electric power is supplied from the high-frequency power supply 17 to generate plasma at a gap between the plasma processing device and the to-be-processed portion of the Si substrate used as a to-be-processed object 15. Further, at this time, in order to cool the plasma source, cooling water can be supplied to or discharged using the constant-temperature water circulating device 18, through the feed-water pipe 5a and the drain pipe 5b. As illustrated in the enlarged view of FIG. 13B, as one example, an insulation layer 60 made of SiOx having a thickness of about 5 μm is provided on the first gas ejecting surface 1a-1 of the first laminated member 1 including the opening portions of the first gas ejecting ports 12a, namely the surface that faces the to-be-processed object 15. The reason for the provision of the insulation layer 60 is as follows. Atmospheric-pressure plasma requires a higher discharge starting voltage and is prone to transition to arc electric discharge, in comparison with plasma generated at reduced pressures. In general, in order to suppress the transition to arc electric discharge, an insulation layer is provided on the electrode surface to be exposed to plasma in many cases and, in the present embodiment, a $SiO_2$ film as an example of the insulation layer 60 is provided on the first gas ejecting surface 1a-1 of the convex portion including the gas ejecting ports 12a. However, a metal layer may be provided on the electrode surface, in view of the resistance to gases used as reactive gases (etching resistance), and the adhesion to the underlying layer, and the easiness of film formation. In the second embodiment, in view of the resistance to fluorine element, the adhesion to Si, and the easiness of film formation, an Ni layer, as an example of the conductive layer 60, is provided on the first gas ejecting surface 1a-1 of the convex portion including the gas ejecting openings.

By using the aforementioned plasma processing apparatus, at first, as one example, the gap distance R between the tip-end surface of the plasma source 100 of the plasma processing apparatus (the first gas ejecting surface 1a-1 including the opening portions of the first gas ejecting ports 12a) and the to-be-processed portion of a Si substrate used as a to-be-processed object 15 was adjusted to 300 μm through the inter-electrode gap adjusting device 20. Further, 10 sccm of He and 0.5 sccm of CF4 were supplied as an example of the first gas, to the first gas flow channel 9 from the first gas supplying device 16a to eject the first gas from the first gas ejecting ports 12a in the first gas ejecting surface. Concurrently, 30 sccm of O2 was supplied as an example of the second gas, from the second gas supplying device 16b to the eleventh gas flow channel 10 to eject the second gas from the second gas ejecting ports 12a towards the periphery of the gap space between the first gas ejecting surface 1a-1 and the to-be-processed portion of the to-be-processed object 15 through the periphery of the convex portion. At this time, a high-frequency electric power of 12 W was supplied to the plasma source 100 from the high-frequency power supply 17 to generate plasma at a gap between the tip end surface of the plasma source 100 of the plasma processing apparatus (the first gas ejecting surface 1a-1 including the opening portions of the first gas ejecting ports 12a) and the to-be-processed portion of the Si substrate used as a to-be-processed object 15. Thus, plasma processing was applied to the to-be-processed portion of the Si substrate employed as the to-be-processed object 15 for 700 s to form an etching groove 15a in the to-be-processed portion. At the same time, as one example, the plasma source 100 of the plasma processing apparatus was moved in the y direction in FIG. 7A, at a speed of 60 μm/min, with the aforementioned inter-electrode gap adjusting device 20. FIG. 10 comprehensively illustrates an example of the etching shapes in a Si substrate as the to-be-processed object 15, according to the sixth embodiment.

Referring to FIG. 10, as one example, the etching depth Y of the etching groove 15a, which was a to-be-processed-portion, was 620 μm, the line width X1 of the upper end portion of the etching groove 15a was 1050 μm, and the line width X2 of the bottom portion of the etching groove 15a was 762 μm. Accordingly, the angle α indicating the verticality of the shape of the etching groove 15a was 68.8°. Accordingly, in performing a fine processing with a depth on the order of several hundreds micrometers, the verticality of the shape of the etching groove 15a was improved and also the plasma processing was completed without being interrupted halfway through the processing.

The improvement of the verticality and the avoidance of the etching interruption could be realized for the following three reasons.

As the first reason, it is possible to maintain the distance R between the to-be-processed object 15 and the plasma source 100 of the plasma processing apparatus within a certain range along with the progress of the etching. If the distance R between the to-be-processed object 15 and the plasma source 100 of the plasma processing apparatus increases, the discharge starting voltage rises, and, as can be explained by Paschen's law, the generation and maintenance of plasma becomes difficult, causing the interruption of the etching rate.

As the second reason, the surface of the plasma source 100 of the plasma processing apparatus which is faced with the to-be-processed object 15 has the convex shape. This enables generating plasma only between the tip end portion of the convex portion of the plasma source 100 of the plasma processing apparatus and the to-be-processed object 15, thereby preventing the side walls of the etching groove 15a of the to-be-processed object 15 from being etched more than necessary.

As the third reason, the second gas is supplied along the side surfaces of the convex portion of the plasma source 100 of the plasma processing apparatus. This can avoid the generation of plasma on the side walls of the etching groove 15a in the to-be-processed object 15. Also, even in the event of generation of plasma on the side walls of the etching groove 15a, the rate of oxidation of Si can be made greater than the rate of etching Si away from the side walls, due to the presence of $O_2$ gas.

As described above, according to the sixth embodiment, in addition to the effects and advantages of the first embodiment the conductive wire 6 of the plasma source 100 of the plasma processing apparatus is maintained at a ground potential while the high-frequency power supply 17 is connected to the counter electrode 22 to apply a high frequency to the counter electrode 22, thereby offering the advantage of the easiness of the connection between the high-frequency power supply 17 to the counter electrode 22. Further, since the counter electrode 22 can be always kept fixed while the high-frequency power supply 17 is connected to the plasma source 100, even when the plasma source 100 is moved while applying high-frequency electric power, it is possible to avoid, without fail, the risks of short-circuits of cables and heat generation therefrom due to the disengagement and bending of the power-supply cable, entanglement of the power-supply cable with other cables.

Seventh Embodiment

Hereinafter, with reference to FIG. 7A, FIG. 10, and FIG. 14, a seventh embodiment of the present invention will be described. Further, a plasma processing apparatus according to the seventh embodiment basically has the same structure as that in FIG. 1 to FIG. 6 and, hereinafter, there will be described only the differences from the plasma processing apparatus according to the first embodiment.

The seventh embodiment is different from the first embodiment in that the plasma processing and the movement of the plasma source 100 of the plasma processing apparatus in the y direction are performed alternately, rather than moving the plasma source 100 of the plasma processing apparatus in the y direction at the same time when the plasma processing is performed (in other words, rather than concurrently performing plasma processing and the movement of the plasma source 100 of the plasma processing apparatus in the y direction). FIG. 14 illustrates the aforementioned processing.

Figure 14:
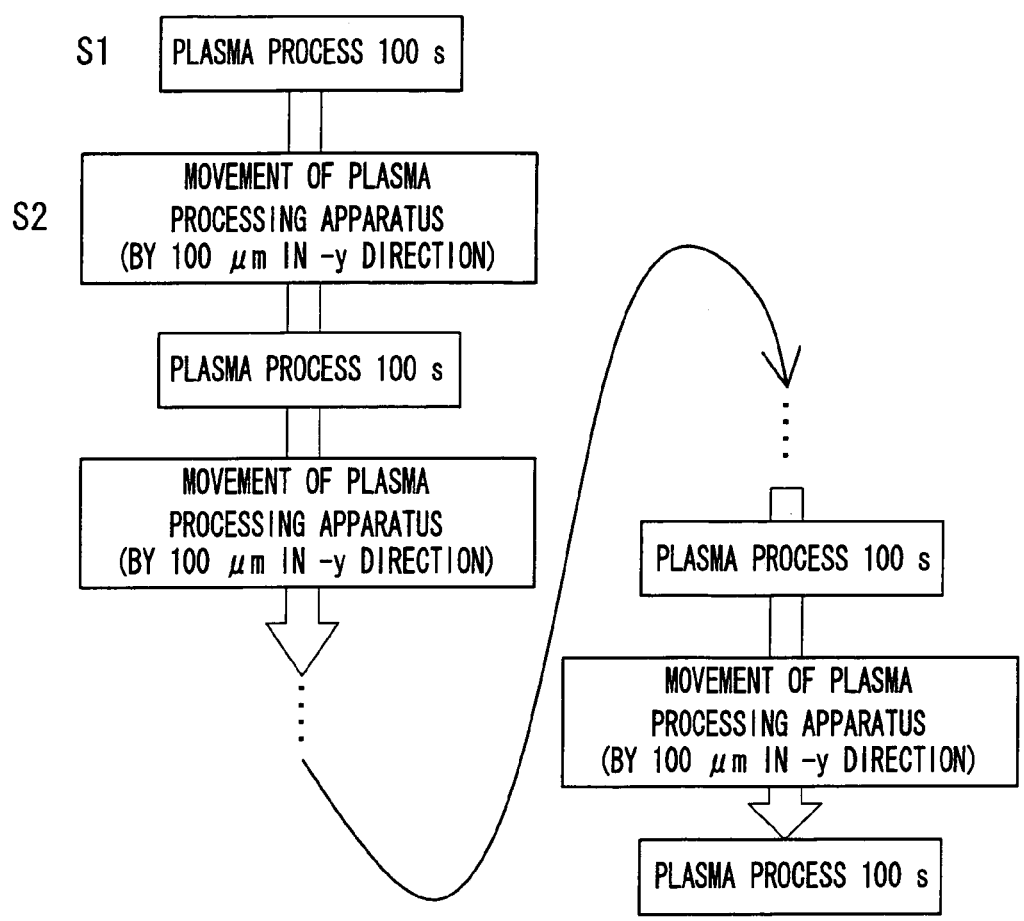
FIG. 14 is a schematic view of the plasma processing apparatus employed in the seventh embodiment of the present invention.

FIG. 14 illustrates an example of the process, in which plural turns are repeated, where each turn includes a step S1 of applying plasma processing to a to-be-processed object 15 for 100 s and then temporary stopping the supply of high-frequency electric power, and a step S2 of moving the plasma source 100 of the plasma processing apparatus towards the to-be-processed object 15 by 100 μm through the inter-electrode gap adjusting device 20.

By using the plasma processing apparatus of FIG. 7A, at first, as one example, the gap distance R between the tip-end surface of the plasma source 100 of the plasma processing apparatus (the first gas ejecting surface 1a-1 including the opening portions of the first gas ejecting ports 12a) and the to-be-processed portion of a Si substrate used as a to-be-processed object 15 was adjusted to 300 μm. Further, 10 sccm of He and 0.5 sccm of CF4 were supplied as an example of the first gas, to the first gas flow channel 9 from the first gas supplying device 16a to eject the first gas from the first gas ejecting ports 12a in the first gas ejecting surface. Concurrently, 30 sccm of O2 was supplied as an example of the second gas, from the second gas supplying device 16b to the eleventh gas flow channel 10 to eject the second gas from the second gas ejecting ports 12a towards the periphery of the gap space between the first gas ejecting surface 1a-1 and the to-be-processed portion of the to-be-processed object 15 through the periphery of the convex portion. At this time, a high-frequency electric power of 12 W was supplied to the plasma source 100 from the high-frequency power supply 17 to generate plasma at a gap between the tip end surface of the plasma source 100 of the plasma processing apparatus (the first gas ejecting surface 1a-1 including the opening portions of the first gas ejecting ports 12a) and the to-be-processed portion of the Si substrate used as a to-be-processed object 15. Thus, plasma processing was applied to the to-be-processed portion of the Si substrate employed as a to-be-processed object 15 for 100 s to form an etching groove 15a in the to-be-processed portion. Thereafter, as one example, the supply of the electric power from the high-frequency power supply 17 to the plasma processing apparatus was temporally stopped and then the plasma source 100 of the plasma processing apparatus was moved by 100 μm in the y direction in FIG. 7A through the inter-electrode gap adjusting device 20. The aforementioned process is defined as a single turn and the total 6 turns of the same process are repeated, and finally, the etching groove 15a is formed by applying a seventh plasma process to the to-be-processed portion of the Si substrate for 100 s. FIG. 10 comprehensively illustrates the etching shapes of the to-be-processed portion in the Si substrate, according to the seventh embodiment.

Referring to FIG. 10, as one example, the etching depth Y of the etching groove 15a, which was the to-be-processed-portion, was 603 μm, the line width X1 of the upper end portion of the etching groove 15a was 930 μm, and the line width X2 of the bottom portion of the etching groove 15a was 840 μm. Accordingly, the angle α indicating the verticality of the shape of the etching groove 15a was 82.9°. Accordingly, in performing a fine processing with a depth on the order of several hundreds micrometers, the verticality of the shape of the etching groove 15a was improved and also the plasma processing was completed without being interrupted halfway through the processing.

The improvement of the verticality and the avoidance of the etching interruption could be realized for the same reason as the three reasons described in the first embodiment.

As described above, according to the aforementioned seventh embodiment, plasma processing and the movement of the plasma source 100 of the plasma processing apparatus in the y direction are alternately performed, which enables sufficiently discharging by-product gases which tend to clog in the space between the tip end surface of the plasma source and the to-be-processed portion of the to-be-processed object 15 during etching reaction. This can improve the uniformity of the gas atmosphere, thereby offering the advantage of the suppression of arc discharge.

Eighth Embodiment

Hereinafter, with reference to FIG. 10 and FIG. 15, an eighth embodiment of the present invention will be described. Further, the plasma processing apparatus according to the eighth embodiment basically has the same structure as that in FIG. 1 to FIG. 6 and, hereinafter, there will be described only the differences from the plasma processing apparatus according to the first embodiment.

The eighth embodiment is different from the first embodiment in that the plasma source 100 of the plasma processing apparatus is moved in the y direction and in the x direction orthogonal to the y direction through a moving mechanism 23 during plasma processing, rather than moving the plasma source 100 of the plasma processing apparatus only in the y direction through the inter-electrode gap adjusting device 20.

The moving mechanism 23 may be constituted by, for example, an upper x-z stage 121 as illustrated in FIG. 7D to FIG. 7F, which is controlled by the controlling device 110.

Figure 15:
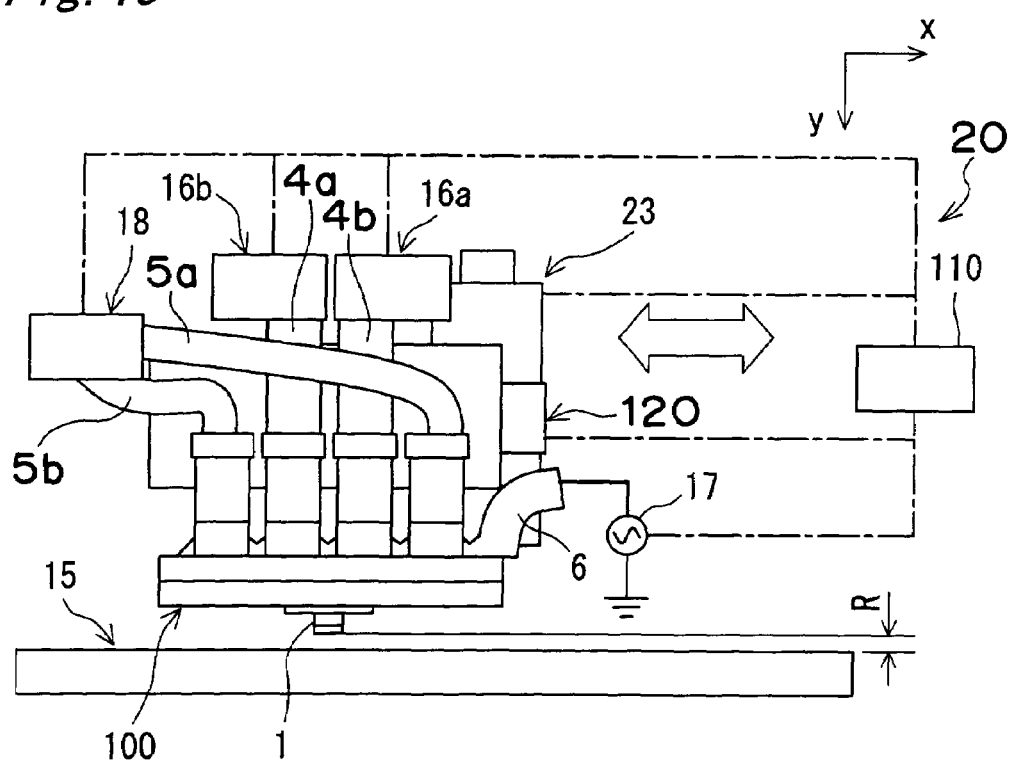
FIG. 15 is a view showing an overview of the plasma processing apparatus employed in the eighth embodiment of the present invention.
Figure 16A:
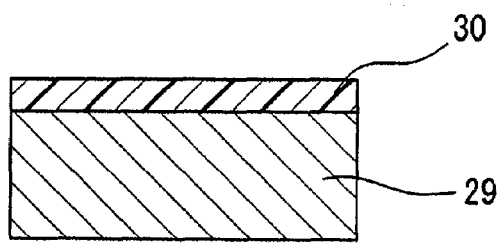
FIG. 16A is a schematic view of a patterning process utilizing a resist process of a conventional art.
Figure 16B:
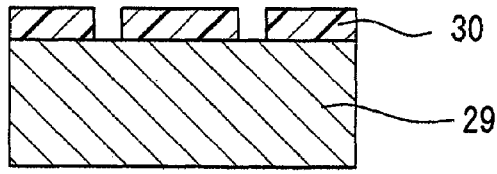
FIG. 16B is a schematic view of a patterning process utilizing a resist process of the conventional art.
Figure 16C:
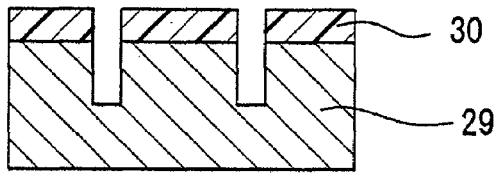
FIG. 16C is a schematic view of a patterning process utilizing a resist process of the conventional art.
Figure 16D:
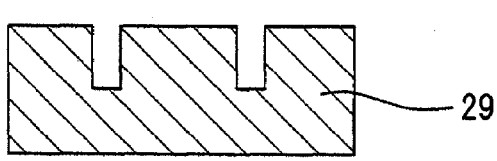
FIG. 16D is a schematic view of a patterning process utilizing a resist process of the conventional art.
Figure 17:
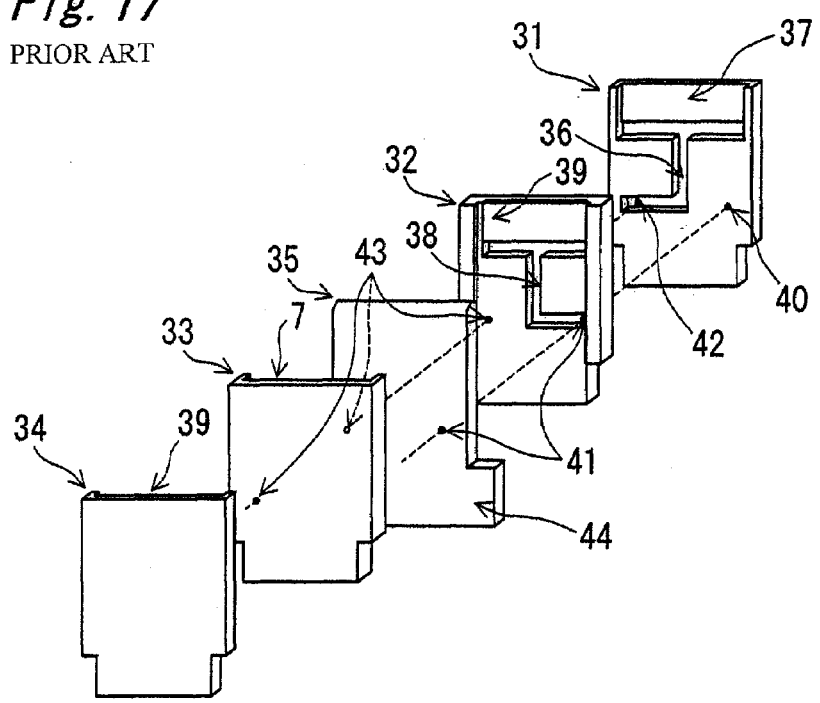
FIG. 17 is an exploded view of a plasma processing apparatus incorporating a micro-plasma source of the conventional art.
Figure 18:
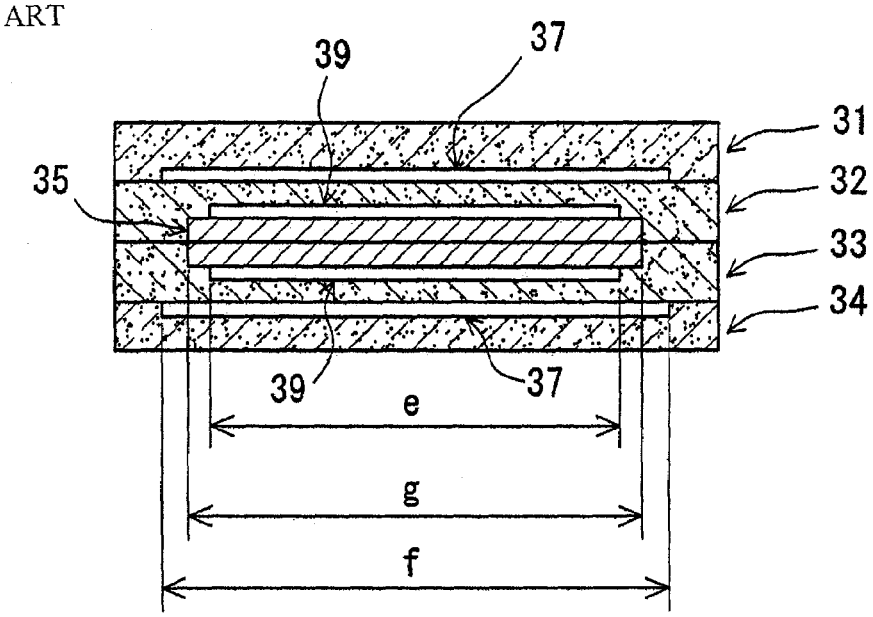
FIG. 18 is a plan view of the plasma processing apparatus incorporating a micro-plasma source of the conventional art.
Figure 19:
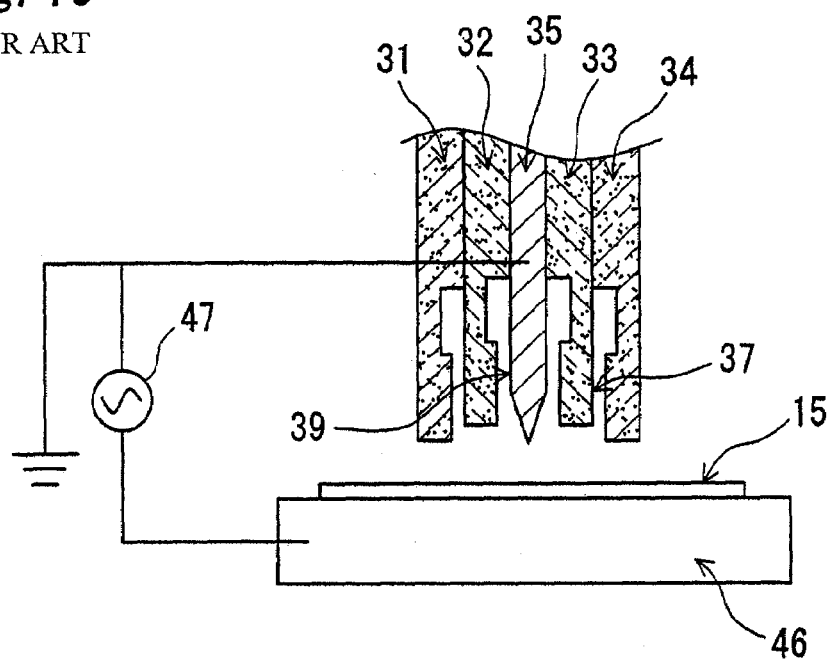
FIG. 19 is a cross-sectional view of the plasma processing apparatus incorporating a micro-plasma source of the conventional art.
Figure 20:
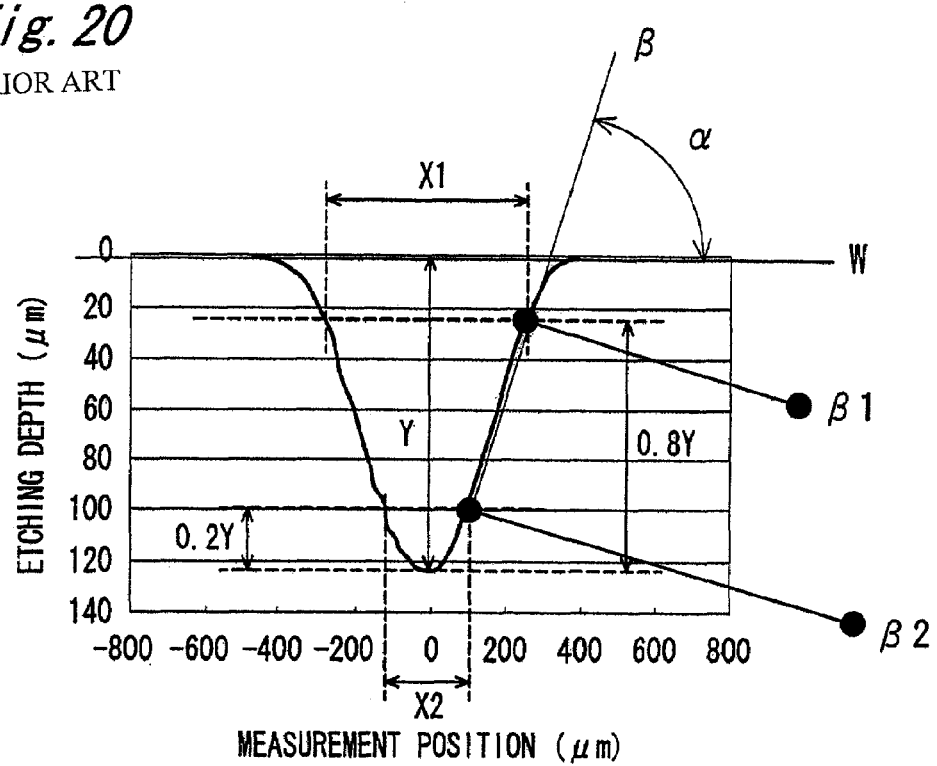
FIG. 20 is a schematic view of an etching shape resulted from processing by the plasma processing apparatus of the conventional art.
Figure 21:
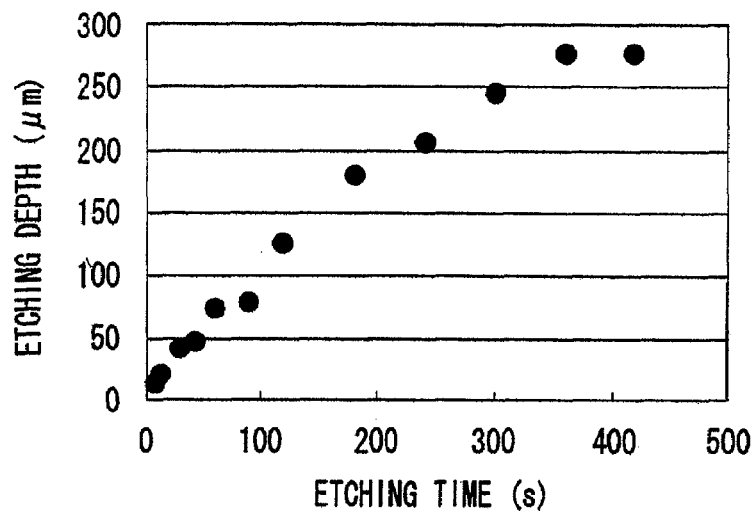
FIG. 21 is a view illustrating the dependence of the etching depth on the etching time, resulted from processing by the plasma processing apparatus of the conventional art.

FIG. 15 is a schematic view illustrating the eighth embodiment. As a plasma processing apparatus, the same plasma processing apparatus as that in the fourth embodiment was employed. At first, as one example, the gap distance R between the tip-end surface of the plasma source 100 of the plasma processing apparatus (the first gas ejecting surface 1a-1 including the opening portions of the first gas ejecting ports 12a) and the to-be-processed portion of a Si substrate used as a to-be-processed object 15 was adjusted to 300 μm through the inter-electrode gap adjusting device 20. Further, 10 sccm of He and 0.5 sccm of CF4 were supplied as an example of the first gas, to the first gas flow channel 9 from the first gas supplying device 16a to eject the first gas from the first gas ejecting ports 12a in the first gas ejecting surface. Concurrently, 30 sccm of O2 was supplied as an example of the second gas, from the second gas supplying device 16b to the eleventh gas flow channel 10 to eject the second gas from the second gas ejecting ports 12a towards the periphery of the gap space between the first gas ejecting surface 1a-1 and the to-be-processed portion of the to-be-processed object 15 through the periphery of the convex portion. At this time, a high-frequency electric power of 12 W was supplied to the plasma source 100 from the high-frequency power supply 17 to generate plasma at a gap between the tip end surface of the plasma source 100 of the plasma processing apparatus (the first gas ejecting surface 1a-1 including the opening portions of the first gas ejecting ports 12a) and the to-be-processed portion of the Si substrate used as a to-be-processed object 15. Concurrently, the plasma source 100 of the plasma processing apparatus was moved in the x direction in FIG. 15 at 480 μm/min through an upper x-z stage 121. Thus, plasma processing was applied to the to-be-processed portion of the Si substrate employed as the to-be-processed object 15 for 600 s to form an etching groove 15a in the to-be-processed portion.

Thereafter, as one example, the supply of the electric power from the high-frequency power supply 17 to the plasma source 100 of the plasma processing apparatus was temporarily stopped and then the plasma source 100 of the plasma processing apparatus was moved by 100 µm in the y direction in FIG. 15 through the inter-electrode gap adjusting device 20.

Then, the electric power from the high-frequency power supply 17 was supplied to the plasma source 100 of the plasma processing apparatus, again, to generate plasma at a gap between the plasma source 100 of the plasma processing apparatus and the to-be-processed portion of the Si substrate employed as the to-be-processed object 15. Concurrently, the plasma source 100 of the plasma processing apparatus was moved in the −x direction in FIG. 15 at 480 µm/min through the upper x-z stage 121 using the moving mechanism 23. Thus, plasma processing was applied to the to-be-processed portion of the Si substrate employed as the to-be-processed object 15 for 600 s to form an etching groove 15a in the to-be-processed portion. The aforementioned process is defined as a single turn, and the total 9 turns of the same process is repeated. FIG. 10 comprehensively illustrates the etching shapes of the Si substrate, according to the eighth embodiment.

Referring to FIG. 10, as one example, the etching depth Y of the etching groove 15a, which was the to-be-processed-portion, was 760 µm, the line width X1 of the upper end portion of the etching groove 15a was 952 µm, and the line width X2 of the bottom portion of the etching groove 15a was 902 µm. Accordingly, the angle α indicating the verticality of the shape of the etching groove 15a was 86.9°. The Si substrate employed as the to-be-processed object 15 had a thickness of 760 µm. Accordingly, in performing a fine processing with a depth on the order of several hundreds micrometers, the verticality of the shape of the etching groove 15a was improved and also the plasma processing was completed without being interrupted halfway through the processing.

The improvement of the verticality and the avoidance of the etching interruption could be realized for the same reason as the three reasons described in the first embodiment.

According to the aforementioned eighth embodiment, the plasma source 100 of the plasma processing apparatus is moved through the inter-electrode gap adjusting device 20 not only in the y direction, but also be moved in the x direction orthogonal to the y direction by the moving mechanism 23, during the plasma process. This enables applying etching over a range wider than the etching groove 15a in a plain shape to form a concave portion, as well as forming a line-shaped etching groove 15a. Also, by varying the depth of the etching groove along the x direction, an etching groove with a tapered shape in the y direction can be formed as another example.

Ninth Embodiment

Hereinafter, with reference to FIG. 22, a ninth embodiment of the present invention will be described. Further, a plasma processing apparatus according to the ninth embodiment basically has the same structure as that in FIG. 1 to FIG. 6 and, hereinafter, there will be described only the differences from the plasma processing apparatus according to the first embodiment.

The ninth embodiment is different from the first embodiment in that the plain along which the gas ejecting ports 12a are provided through the second laminated member 2 is inclined with respect to the y axis at an angle ϵ=30°. Further, the supplying operations of the first gas supplying device 16a and the second gas supplying device 16b are controlled to change the flow rate of the second gas with respect to that of the first gas in accordance with process progress, under the control of the controlling device 110.

By using the plasma processing apparatus, at first, the gap distance R between the plasma source 100 of the plasma processing apparatus and the to-be-processed portion of a Si substrate employed as an example of a to-be-processed object 15 was adjusted to 300 µm through the inter-electrode gap adjusting device 20. Further, 10 sccm of He and 0.5 sccm of CF4 were supplied as an example of the first gas, to the first gas flow channel 9 from the first gas supplying device 16a to eject the first gas from the first gas ejecting ports 12a in the first gas ejecting surface. Concurrently, 30 sccm of O2 was supplied as an example of the second gas, from the second gas supplying device 16b to the eleventh gas flow channel 10 to eject the second gas from the second gas ejecting ports 12a in substantially a rectangular cylindrical shape reaching the periphery of the gap space between the first gas ejecting surface 1a-1 and the to-be-processed portion of the to-be-processed object 15 through the entire periphery of the first laminated member 1. At this time, a high-frequency electric power of 12 W was supplied to the plasma source 100 from the high-frequency power supply 17 to generate plasma in the gap space between the tip end surface of the plasma source 100 of the plasma processing apparatus (the first gas ejecting surface 1a-1 including the opening portions of the first gas ejecting ports 12a) and the to-be-processed portion of the Si substrate employed as the to-be-processed object 15, wherein the gap space has been supplied with the first gas. Thus, plasma processing was applied to the to-be-processed portion of the Si substrate employed as the to-be-processed object 15 to form an etching groove 15a in the to-be-processed portion.

Figure 22:
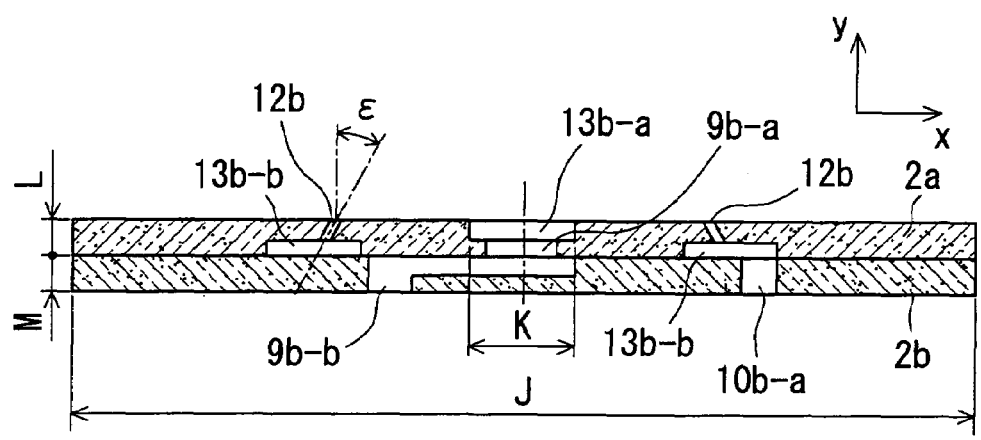
FIG. 22 is an enlarged cross-sectional view of the second laminated member in a plasma processing apparatus employed in a ninth embodiment of the present invention.

Further, the plasma source 100 of the plasma processing apparatus was moved in the y direction in FIG. 22 at a speed of 60 µm/min through the inter-electrode gap adjusting device 20, under the control of the controlling device 110. At this time, the supplying operation of the second gas supplying device 16b was controlled to reduce the flow rate of O2 gas ejected from the second gas ejecting ports 12b at a rate of, as one example, 2.3/min, under the control of the controlling device 110. Thus, a plasma process was applied to the to-be-processed portion of the Si substrate for 700 s to form an etching groove 15a in the to-be-processed portion. Here, as an example, the amount of O2 gas supplied at the start of the plasma process is set to 30 sccm, and the flow rate of O2 gas supplied after 700 s is set to about 3 sccm.

In performing a fine processing with a depth on the order of several hundreds micrometers according to the aforementioned method, the verticality of the etching shape of the etching groove 15a was improved and also the plasma processing was completed without being interrupted halfway through the processing.

The improvement of the verticality and the avoidance of the etching interruption could be realized for the same reason as the three reasons described in the first embodiment. While there has been described the case where the gas ejecting ports 12a provided through the second laminated member 2 form an angle ϵ of 30° with respect to the y axis, it is preferable that the angle ϵ is approximately not less than 0° and not more than 65°. If the angle is less than 0°, the second gas may not be efficiently supplied to the to-be-processed portion. If the angle is greater than 65°, this can cause collision of the second gas to the side surfaces of the first laminated member 1 to generate turbulent flows, which prevents the second gas from being efficiently supplied to the to-be-processed portion.

As described above, according to the aforementioned ninth embodiment, the plain along which the gas ejecting ports 12a are provided through the second laminated member 2 is inclined at an angle $\epsilon=30°$ with respect to the y axis, and thus the second gas may be efficiently supplied to the to-be-processed portion, because the occurrence of turbulent flows due to the collision of the second gas to the side surfaces of the first laminated member 1 is prevented. In other words, if the angle with respect to the y axis is greater than 30°, machining during the fabrication of the plasma source becomes difficult, and if the angle with respect to the y axis is smaller than 30°, the turbulent flows can easily occur. Accordingly, the angle with respect to the y axis is preferably about 30°. Further, according to the ninth embodiment, the supplying operations of the first gas supplying device 16a and the second gas supplying device 16b are controlled to change the flow rate of the second gas with respect to that of the first gas in accordance with the process progress, under the control of the controlling device 110, and accordingly, the second gas may not intrude easily into the space between the tip end surface of the plasma source and the to-be-processed portion of the to-be-processed object 15, the reduction of the plasma density can be suppressed, and thus, the etching rate may be increased. Moreover, it is possible to utilize the second gas efficiently, and reduce the running cost.

While, in the aforementioned various embodiments of the present invention, there has been exemplified the case where plasma is generated using high-frequency electric power supply with a frequency of 13.56 MHz, it is also possible to generate plasma using high-frequency electric power with a frequency in the range of several hundreds kHz to several GHz. Also, DC electric power or pulse electric power may be supplied. In the case of employing a pulse electric power, positive and negative pulses can be alternately supplied to eliminate the electrification of dielectric materials to continuously generate electric discharge. Further, when pulses are supplied, there is no need for the provision of the effect of preventing arc discharge (spark) and, therefore, the pulses are not required to be significantly high-speed pulses and may have a frequency in the range of several tens of Hz to several hundreds Hz. As a matter of cause, when high-speed pulses with a frequency in the range of several kHz to several MHz are supplied, it is possible to more effectively suppress arc discharge (spark).

Further, while in the aforementioned various embodiments the supplied electric power has been specified as an electric power value, the start of electric discharge substantially depends on the voltage. It is preferable that the supplied voltage is in the range of 100 V to 100 kV. If the supplied voltage is below 100 V, the electric discharge might not be caused. If the supplied voltage exceeds 100 kV, the arc discharge (spark) may be caused. More preferably, the voltage is in the range of 1 kV to 10 kV. If the supplied voltage is below 1 kV, electric discharge can not be caused. If the supplied voltage exceeds 10 kV, this may cause arc discharge (spark).

Moreover, although, in the aforementioned various embodiments, only the movement in the x direction and the movement in the y direction have been described as being attained through the movement of the plasma source 100 and the plasma processing apparatus, it is also possible to move the to-be-processed object 15 to change the distance between the to-be-processed object 15 and the plasma processing apparatus and the position of the to-be-processed object 15 relative to the plasma processing apparatus.

While, in the aforementioned various embodiments, only the layers including patterns formed therein have been described as being made of only Si, it is preferable to employ a material having a volume resistivity of $10^{-1}$ Ω·cm or less. If the volume resistivity exceeds $10^{-1}$ Ω·cm, this will increase the electric power loss at portions other than the portion to be subjected to a desired load, thereby inducing unnecessary heat or increasing the difficulty of matching it with the desired load. Accordingly, it is preferable to employ a part of semiconductors or metal materials.

Also, it is possible to combine some of the devices or methods described in the aforementioned various embodiments, such as cases of changing the material coated to the surface including the first gas ejecting ports, changing the shape of the laminated members, changing the electrode for applying electric power thereto, alternately performing the generation of plasma and the movement of the plasma processing apparatus, in order to perform plasma processing to provide an etching shape with more excellent verticality without causing interruption of etching in the depthwise direction.

Further, while in the aforementioned various embodiments only SiOx and Ni have been exemplified as materials coated to the first gas ejecting surface 1a-1 including the first gas ejecting ports, it is preferable to employ a material which exhibits higher etching resistance to reactive gases ejected from the first gas ejecting ports, than the material of the layers including the patterns formed therein. If a material having poor etching resistance is employed, this will reduce the number of plasma-activated gas species reaching the to-be-processed object, thereby reducing the processing speed or reducing the maintenance period of the plasma source. Accordingly, when the layers including the patterns formed therein are made of Si, it is possible to employ a metal material mainly consisting of at least one of Ag, Al, Au, Co, Cr, Cu, Fe, Mg, Mo, Ni, Pt, Si, Ti, Ta, and W or an insulation material made of an oxide, a nitride, or a fluoride containing these elements to provide the same effects as those in the aforementioned various embodiments of the present invention.

Further, while, in the aforementioned various embodiments, only the first gas ejecting ports and the second gas ejecting ports each having an opening length of Φ30 μm have been described as an example, it is preferable that the opening length is approximately not less than 200 nm and not more than 50 μm. As the opening length of the first gas ejecting ports and the second gas ejecting ports is decreased, the uniformity of gas within the surface is improved, thereby improving the uniformity of plasma or suppressing the occurrence of arc discharge (spark). Therefore, the smaller the opening length, the more preferable it is. The conventional mechanical machining is limited to the order of about 50 μm, and therefore, it is difficult to realize complex configurations such as described in the various embodiments according to the present invention. In addition, if the opening length is smaller than 200 nm, this will increase the difficulty of performing machining during the fabrication of the plasma source even with vacuum dry etching or laser machining techniques or increase the machining cost. Accordingly, it is preferable that the opening length is approximately not less than 200 nm and not more than 50 μm.

Further, in the aforementioned various embodiments, as one example, only an inert gas He and a reactive gas $CF_4$ have been exemplified as gases ejected from the first gas ejecting ports. However, not limited to He and $CF_4$, and it is preferable that the gas contains an inert gas such as Ar, Kr, Ne, or Xe by 80% or more and a reactive gas such as $SF_6$, $CxFy$ (x and y are natural numbers) such as $C_4F_8$, halogen-containing gas such as $NF_3$, $Cl_2$, or HBr, $N_2$, or $O_2$. If the content of an inert gas is less than 80%, this will tend to cause arc discharge (spark), thereby causing the oxidation of the to-be-processed surface and preventing a desired plasma process from being attained.

Further, if a reactive gas suitable for the to-be-processed object is not contained therein, this may prevent a desired plasma process from being attained.

While, in the aforementioned various embodiments, there have been described only cases where $O_2$ is used as the gas for ejecting from the second gas ejecting ports to cause the oxidation of the side walls of the to-be-processed surface, the gas is not limited to $O_2$ and a proper gas may be selected depending on the to-be-processed object or the content of intended modification. For example, in order to cause nitriding, it is possible to employ N2 or air. Also, in order to cause fluoriding, it is possible to employ $SF_6$ or CxFy (x and y are natural numbers) such as $CF_4$, $NF_3$, or fluorine-containing gases.

While, in the aforementioned various embodiments, only etching processes have been exemplified, the present invention is not limited to etching and may be applied to various plasma processes. For example, the present invention may be applied to surface treatments such as water repellent, water-receptive, oxidation, reducing, fluoriding, or nitriding; doping; or thin-film deposition such as CVD or sputtering.

Further, arbitrary embodiments out of the aforementioned various embodiments may be properly combined to offer the effects of their embodiments.

According to the plasma processing apparatus and method, it is possible to apply a plasma process to desired to-be-finely-processed portions with depths on the order of several hundreds nanometers to several hundreds micrometers to provide etching shapes with excellent verticality without causing etching interruptions in the depthwise direction. Accordingly, the present invention may be widely applied as components for performing surface treatments, thin-film deposition, and etching using as well as to etching for MEMS (Micro Electro Mechanical System) devices. Therefore, the present invention can be utilized for fabricating semiconductors; displays such as liquid crystal displays, FEDs (Field Emission Displays), or PDPs; electronic components; or printed boards.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A plasma processing method employing a plasma source including a gas flow channel formed therein and an electrode which is fed with electric power or grounded to be maintained at a controlled electric potential, a first gas ejecting surface of said plasma source including an opening portion of a first gas ejecting port for ejecting a first gas for causing electric discharge being placed in parallel to a to-be-processed object, the method comprising:

supplying said first gas to said first gas ejecting port from a first gas supplying device to eject said first gas from said first gas ejecting port toward a gap between a first gas ejecting surface of said plasma source and a to-be-processed portion of said to-be-processed object while supplying electric power to said plasma source, said to-be-processed object or a counter electrode placed on a surface of said to-be-processed object opposite from the to-be-processed portion thereof to generate an electric-potential difference between said plasma source and said to-be-processed object to generate plasma, wherein a plasma process is applied to said to-be-processed portion of said to-be-processed object while a convex portion at a portion of a surface of said plasma source which is faced to said to-be-processed object is inserted into said to-be-processed portion of said to-be-processed object, said first gas ejecting surface of said plasma source including the opening portion of said first gas ejecting port is formed at the convex portion and the convex portion has a size which can be inserted into a to-be-finely-processed portion of said to-be-processed object.

2. The plasma processing method according to claim 1, wherein during applying a plasma process to said to-be-processed portion of said to-be-processed object while inserting said convex portion into said to-be-processed portion of said to-be-processed object, the plasma process is applied to said to-be-processed portion of said to-be-processed object while said convex portion is inserted into a to-be-finely-processed portion with a depth on order of several hundreds nanometers to several hundreds micrometers.

3. The plasma processing method according to claim 1, wherein a second gas for suppressing electric discharge is ejected from a second gas ejecting port provided at a different position from said first gas ejecting surface of said plasma source to a periphery of the gap between said second gas ejecting surface of said plasma source and the to-be-processed portion of said to-be-processed object.

4. The plasma processing method according to claim 3, wherein said second gas is ejected from said second gas ejecting port to the periphery of said gap to apply surface treatment to the side surface portion of said to-be-processed portion of said to-be-processed object.

5. The plasma processing method according to claim 1, wherein during applying a plasma process to said to-be-processed portion of said to-be-processed object while inserting said convex portion into said to-be-processed portion of said to-be-processed object, said plasma source and said to-be-processed object are moved relative to each other such that the distance between said first gas ejecting surface of said plasma source and the to-be-processed portion of said to-be-processed object is maintained within a certain range.

6. The plasma processing method according to claim 1, wherein the plasma process is performed under a pressure near atmospheric pressure or a pressure equal to or higher than the atmospheric pressure.

* * * * *